United States Patent
Yang et al.

(10) Patent No.: US 7,253,576 B2
(45) Date of Patent: Aug. 7, 2007

(54) E/I CORE ACTUATOR COMMUTATION FORMULA AND CONTROL METHOD

(75) Inventors: Pai-Hsueh Yang, Palo Alto, CA (US); Kazuhiro Hirano, Saitama (JP); Ping-Wei Chang, San Jose, CA (US); Tim Teng, Fremont, CA (US); Bausan Yuan, San Jose, CA (US)

(73) Assignee: Nikon Corporation, Tokyo (JP)

( * ) Notice: Subject to any disclaimer, the term of this patent is extended or adjusted under 35 U.S.C. 154(b) by 193 days.

(21) Appl. No.: 10/819,041

(22) Filed: Apr. 5, 2004

(65) Prior Publication Data
US 2005/0218842 A1    Oct. 6, 2005

(51) Int. Cl.
*H02P 1/00* (2006.01)

(52) U.S. Cl. ............... 318/560; 318/432; 318/114; 310/12

(58) Field of Classification Search .......... 310/12; 33/1 M; 355/53, 72; 318/560, 432, 114
See application file for complete search history.

(56) References Cited

U.S. PATENT DOCUMENTS

| | | | |
|---|---|---|---|
| 5,157,296 A | 10/1992 | Trumper | |
| 5,196,754 A | 3/1993 | Berthold et al. | |
| 5,294,854 A | 3/1994 | Trumper | |
| 5,699,621 A | 12/1997 | Trumper et al. | |
| 6,069,417 A * | 5/2000 | Yuan et al. | ............ 310/12 |
| 6,130,517 A | 10/2000 | Yuan et al. | |
| 6,472,777 B1 | 10/2002 | Teng et al. | |
| 6,750,625 B2 * | 6/2004 | Binnard et al. | ............ 318/592 |
| 7,034,474 B2 | 4/2006 | Yang et al. | |

OTHER PUBLICATIONS

U.S. Appl. No. 09/139,954 by Teng et al., application filed Sep. 25, 2998.*
U.S. Appl. No. 09/139,954, filed Aug. 25, 1998, Teng et al.

* cited by examiner

*Primary Examiner*—Rina Duda
(74) *Attorney, Agent, or Firm*—Steven G. Roeder; James P. Broder

(57) ABSTRACT

A stage assembly (220) for moving a device (200) includes a stage (208), and actuator pair (226) and a control system (224). The actuator pair (226) includes a first actuator (228) that is coupled to the stage (208). The first actuator (228) has a first E core (236) and a first I core (240) that is spaced apart a first gap ($g_1$) from the first E core (236). The control system (224) directs current to the first actuator (228) to move the stage (208). In one embodiment, the amount of current directed to the first actuator (228) is determined utilizing a first parameter (a) that is added to the first gap ($g_1$). The value of the first parameter (a) is determined by experimental testing. Additionally, the amount of current directed to the first actuator (228) can be determined utilizing a second parameter (b) that is added to the first gap ($g_1$). The value of the second parameter (b) is determined by experimental testing.

32 Claims, 14 Drawing Sheets

| a[μm] | b[μm] | -K$_{EI}$(Nt/m)  (approximately) | | | |
|---|---|---|---|---|---|
| | | 1st Pair | 2nd Pair | 3rd Pair | 4th Pair |
| 200 | 0 | 32 | 40 | 44 | 50 |
| 180 | 0 | 47 | 53 | 57 | 62 |
| 220 | 0 | 65 | 42 | 39 | 33 |
| 220 | 20 | -5 | -11 | -18 | -12 |
| 180 | -20 | 45 | 109 | 104 | 115 |
| 180 | 20 | 4 | 8 | 10 | 14 |
| 220 | -20 | 72 | 79 | 83 | 87 |

E/I CORE ACTUATOR COMMUTATION FORMULA AND CONTROL METHOD

FIELD OF THE INVENTION

The present invention relates generally to a commutation formula for controlling the output force from an E/I core actuator pair.

BACKGROUND

Exposure apparatuses are commonly used to transfer images from a reticle onto a semiconductor wafer during semiconductor processing. A typical exposure apparatus includes an illumination source, a reticle stage assembly that retains a reticle, an optical assembly, a wafer stage assembly that retains a semiconductor wafer, a measurement system, and a control system.

In one embodiment, the wafer stage assembly includes a wafer stage that retains the wafer, and a wafer mover assembly that precisely positions the wafer stage and the wafer. Somewhat similarly, the reticle stage assembly includes a reticle stage that retains the reticle, and a reticle mover assembly that precisely positions the reticle stage and the reticle.

The size of the images and features within the images transferred onto the wafer from the reticle are extremely small. Accordingly, the precise positioning of the wafer and the reticle relative to the optical assembly is critical to the manufacture of high density, semiconductor wafers.

Recently, E/I core type actuator pairs have been used in the wafer stage assembly and/or the reticle stage assembly. E/I core type actuator pairs can include a pair of generally "E" shaped electromagnets and a pair of "I" shaped targets that are positioned between the two electromagnets. Each electromagnet has an electrical coil wound around the center section. Current directed through the coils creates an electromagnetic field that attracts the target toward the electromagnet. The amount of current determines the amount of attraction. By making the current through one coil of the pair to be larger than the current through the other coil in the pair, a differential force can be produced to draw the target in one direction or its opposing direction. This resultant force can be used to move a stage or other device. For, example, for an exposure apparatus, the control system can direct current to the electromagnets to control the position of the stage.

Each electromagnet and target is separated by an air gap g that is very small. Currently, some system designers use the following formula to calculate the attractive force between the electromagnet and the target:

$$F = K(i/g)^2$$

Where F is the attractive force, measured in Newtons; K is an electromagnetic constant which is dependent upon the geometries of the E-shaped electromagnet, I-shaped target and number of conductor turns about the magnet; i is the current, measured in amperes; and g is the gap distance, measured in meters.

Application of the above equation presumes that the "E" shaped electromagnets and the "I" shaped targets are manufactured and aligned to exacting specifications. When the electromagnets and the targets do not meet these exacting specifications, the actual force produced by the E/I core actuator does not match the expected force calculated from the above equation. This inability to match the expected force and the actual force can cause limitations in the usage of E/I cores, and degrade overall system performance.

In light of the above, there is a need for a generalized E/I core commutation formula that compensates for the non-linearity of the E/I core force function and/or provides a linear transfer function between the input force command and actual EI force output. Further, there is a need for an E/I core commutation formula that compensates for the actual shape and alignment of the E/I cores. Additionally, there is a need for an EI commutation formula that minimizes the mismatch between the commutation and actual force function. Moreover, there is a need for an E/I core commutation formula that improves E/I core actuator performance and overall system performance.

SUMMARY

The present invention is directed to a stage assembly that includes a stage, an actuator pair and a control system. The actuator pair includes a first actuator that is coupled to the stage. The first actuator has a first E core and a first I core that is spaced apart a first gap from the first E core. The control system directs current to the first actuator to move the stage. In one embodiment, the amount of current directed to the first actuator is determined utilizing a first parameter that is added to the first gap.

The value of the first parameter is determined by experimental testing of the actuator pair. For example, the value of the first parameter can be between approximately 50 and 600 micrometers. As examples, the first parameter can be approximately 100, 150, 200, 250, 300, 350, 400, 450, 500, or 550 micrometers.

Additionally, the amount of current directed to the first actuator can be determined utilizing a second parameter that is added to the first gap. The value of the second parameter is also determined by experimental testing of the actuator pair. For example, the value of the second parameter can be between approximately 0 and 300 micrometers. As examples, the second parameter can be approximately 50, 100, 150, 200, or 250 micrometers.

As provided herein, at least one of the parameters has a value that is not equal to zero. For example, both of the parameters can have a value that is not equal to zero.

In one embodiment, the amount of current $I_1$ directed to the first actuator is calculated using the following formula:

$$I_1 = \sqrt{\frac{1}{k}(g_1 + a)(g_1 + b)\left(F_0 + \frac{\Delta F}{2}\right)}$$

where k is an electromagnetic constant; $g_1$ is the first gap; a is the first parameter; b is the second parameter; $F_0$ is the bias force; and $\Delta F$ is the net force created by the actuator pair.

In one embodiment, the stage assembly includes a stage support that supports the stage. In this embodiment, the value of the first parameter and/or the second parameter is adjusted to compensate for the stiffness of the stage support.

In one embodiment, the first actuator is an electromagnetic actuator. In this embodiment, the actuator pair includes a second actuator that is also coupled to the stage. The second actuator has a second E core and a second I core that is spaced apart a second gap from the second E core. Further, the control system directs current to the second actuator to move the stage. With this design, the actuators work in pairs in a pull-pull fashion, each core acting in either a positive or negative direction to render bi-direction force output.

The commutation used by the control system globally compensates for the non-linearity of E/I core force function and provides a linear transfer function between the input force command and actual EI force output. The commutation reduces the mismatch between the calculated force and the actual force and enhances the performance of the actuator pair.

The present invention is also directed to an exposure apparatus, a wafer, a method for making a stage assembly, a method for making an exposure apparatus, a method for making a wafer, and a method for making a device.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
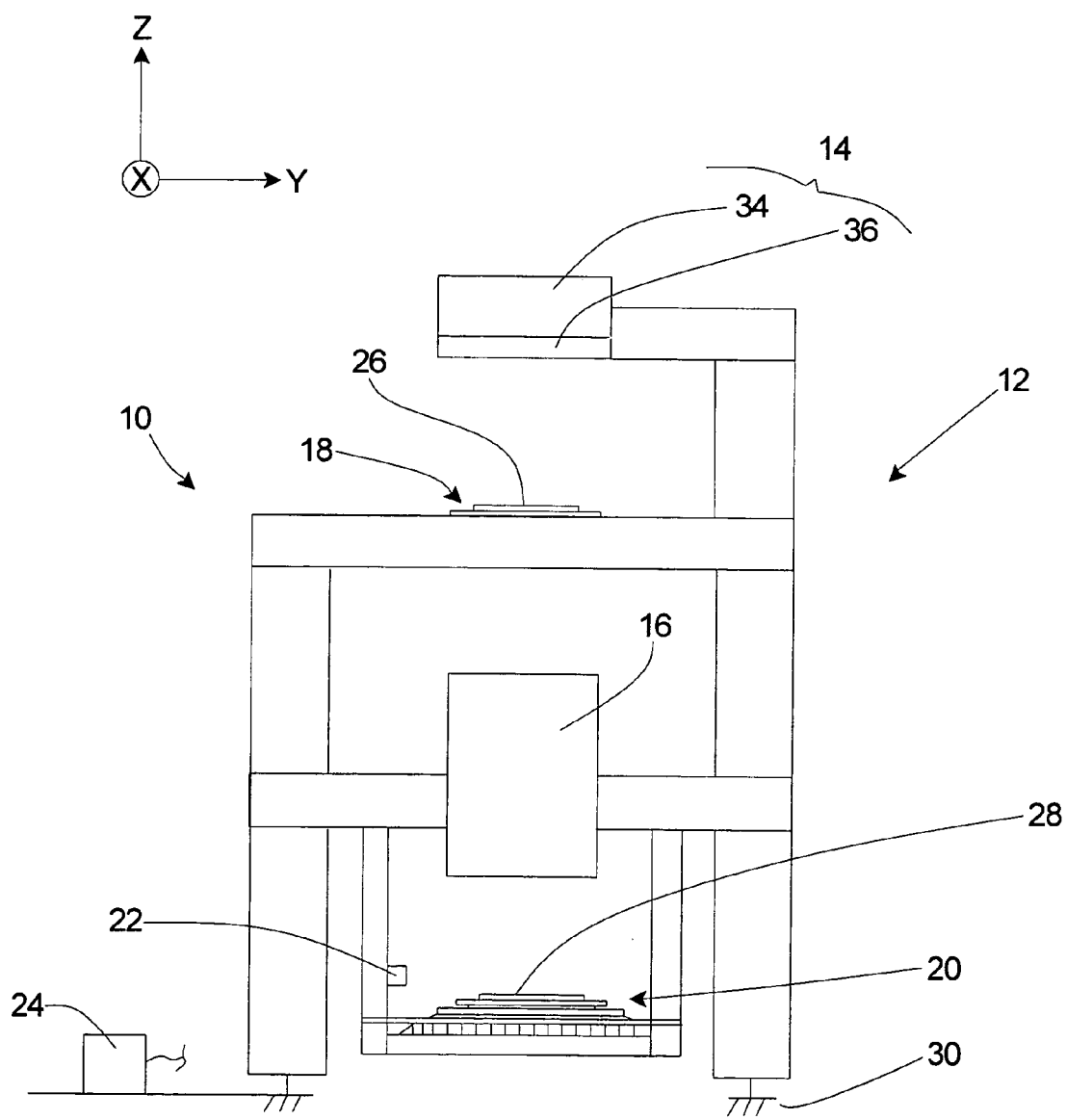
FIG. 1 is a schematic view of an exposure apparatus having features of the present invention.

FIG. 1 is a schematic illustration of a precision assembly, namely an exposure apparatus 10 having features of the present invention. The exposure apparatus 10 includes an apparatus frame 12, an illumination system 14 (irradiation apparatus), an optical assembly 16, a reticle stage assembly 18, a wafer stage assembly 20, a measurement system 22, and a control system 24.

The design of the components of the exposure apparatus 10 can be varied to suit the design requirements of the exposure apparatus 10.

As provided herein, the control system 24 utilizes a commutation formula that improves the accuracy in the control of at least one of the stage assemblies 18, 20.

A number of Figures include an orientation system that illustrates an X axis, a Y axis that is orthogonal to the X axis and a Z axis that is orthogonal to the X and Y axes. It should be noted that these axes can also be referred to as the first, second and third axes.

The exposure apparatus 10 is particularly useful as a lithographic device that transfers a pattern (not shown) of an integrated circuit from a reticle 26 onto a semiconductor wafer 28. The exposure apparatus 10 mounts to a mounting base 30, e.g., the ground, a base, or floor or some other supporting structure.

There are a number of different types of lithographic devices. For example, the exposure apparatus 10 can be used as scanning type photolithography system that exposes the pattern from the reticle 26 onto the wafer 28 with the reticle 26 and the wafer 28 moving synchronously. In a scanning type lithographic device, the reticle 26 is moved perpendicularly to an optical axis of the optical assembly 16 by the reticle stage assembly 18 and the wafer 28 is moved perpendicularly to the optical axis of the optical assembly 16 by the wafer stage assembly 20. Scanning of the reticle 26 and the wafer 28 occurs while the reticle 26 and the wafer 28 are moving synchronously.

Alternatively, the exposure apparatus 10 can be a step-and-repeat type photolithography system that exposes the reticle 26 while the reticle 26 and the wafer 28 are stationary. In the step and repeat process, the wafer 28 is in a constant position relative to the reticle 26 and the optical assembly 16 during the exposure of an individual field. Subsequently, between consecutive exposure steps, the wafer 28 is consecutively moved with the wafer stage assembly 20 perpendicularly to the optical axis of the optical assembly 16 so that the next field of the wafer 28 is brought into position relative to the optical assembly 16 and the reticle 26 for exposure. Following this process, the images on the reticle 26 are sequentially exposed onto the fields of the wafer 28 so that the next field of the wafer 28 is brought into position relative to the optical assembly 16 and the reticle 26.

However, the use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern from a mask to a substrate with the mask located close to the substrate without the use of a lens assembly.

The apparatus frame 12 is rigid and supports the components of the exposure apparatus 10. The apparatus frame 12 illustrated in FIG. 1 supports the optical assembly 16 and the illumination system 14 above the mounting base 30.

The illumination system 14 includes an illumination source 34 and an illumination optical assembly 36. The illumination source 34 emits a beam (irradiation) of light energy. The illumination optical assembly 36 guides the beam of light energy from the illumination source 34 to the optical assembly 16. The beam illuminates selectively different portions of the reticle 26 and exposes the wafer 28. In FIG. 1, the illumination source 34 is illustrated as being supported above the reticle stage assembly 18. Typically, however, the illumination source 34 is secured to one of the sides of the apparatus frame 12 and the energy beam from the illumination source 34 is directed to above the reticle stage assembly 18 with the illumination optical assembly 36.

The illumination source 34 can be a g-line source (436 nm), an i-line source (365 nm), a KrF excimer laser (248 nm), an ArF excimer laser (193 nm) or a $F_2$ laser (157 nm). Alternatively, the illumination source 34 can generate charged particle beams such as an x-ray or an electron beam. For instance, in the case where an electron beam is used, thermionic emission type lanthanum hexaboride ($LaB_6$) or tantalum (Ta) can be used as a cathode for an electron gun. Furthermore, in the case where an electron beam is used, the structure could be such that either a mask is used or a pattern can be directly formed on a substrate without the use of a mask.

The optical assembly 16 projects and/or focuses the light passing through the reticle 26 to the wafer 28. Depending upon the design of the exposure apparatus 10, the optical assembly 16 can magnify or reduce the image illuminated on the reticle 26. The optical assembly 16 need not be limited to a reduction system. It could also be a 1× or magnification system.

When far ultra-violet rays such as the excimer laser is used, glass materials such as quartz and fluorite that transmit far ultra-violet rays can be used in the optical assembly 16. When the $F_2$ type laser or x-ray is used, the optical assembly 16 can be either catadioptric or refractive (a reticle should also preferably be a reflective type), and when an electron beam is used, electron optics can consist of electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. patent application No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

The reticle stage assembly 18 holds and positions the reticle 26 relative to the optical assembly 16 and the wafer 28. Somewhat similarly, the wafer stage assembly 20 holds and positions the wafer 28 with respect to the projected image of the illuminated portions of the reticle 26. The wafer stage assembly 20 is described in more detail below.

Further, in photolithography systems, when linear motors (see U.S. Pat. Nos. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically transferred to the floor (ground) by use of a frame member as described in U.S. Pat. No. 5,528,100 and published Japanese Patent Application Disclosure No. 8-136475. Additionally, reaction forces generated by the reticle (mask) stage motion can be mechanically transferred to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,100 and 5,874,820 and Japanese Patent Application Disclosure No. 8-330224 are incorporated herein by reference.

The measurement system 22 monitors movement of the reticle 26 and the wafer 28 relative to the optical assembly 16 or some other reference. With this information, the control system 24 can control the reticle stage assembly 18 to precisely position the reticle 26 and the wafer stage assembly 20 to precisely position the wafer 28. For example, the measurement system 22 can utilize multiple laser interferometers, encoders, and/or other measuring devices.

The control system 24 receives information from the measurement system 22 and controls one or both of the mover of the stage assemblies 18, 20 to precisely position the reticle 26 and/or the wafer 28. The control system 24 includes one or more processors and circuits for performing the functions described herein. A portion of the control system 24 is described in more detail below.

A photolithography system (an exposure apparatus) according to the embodiments described herein can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 2A:
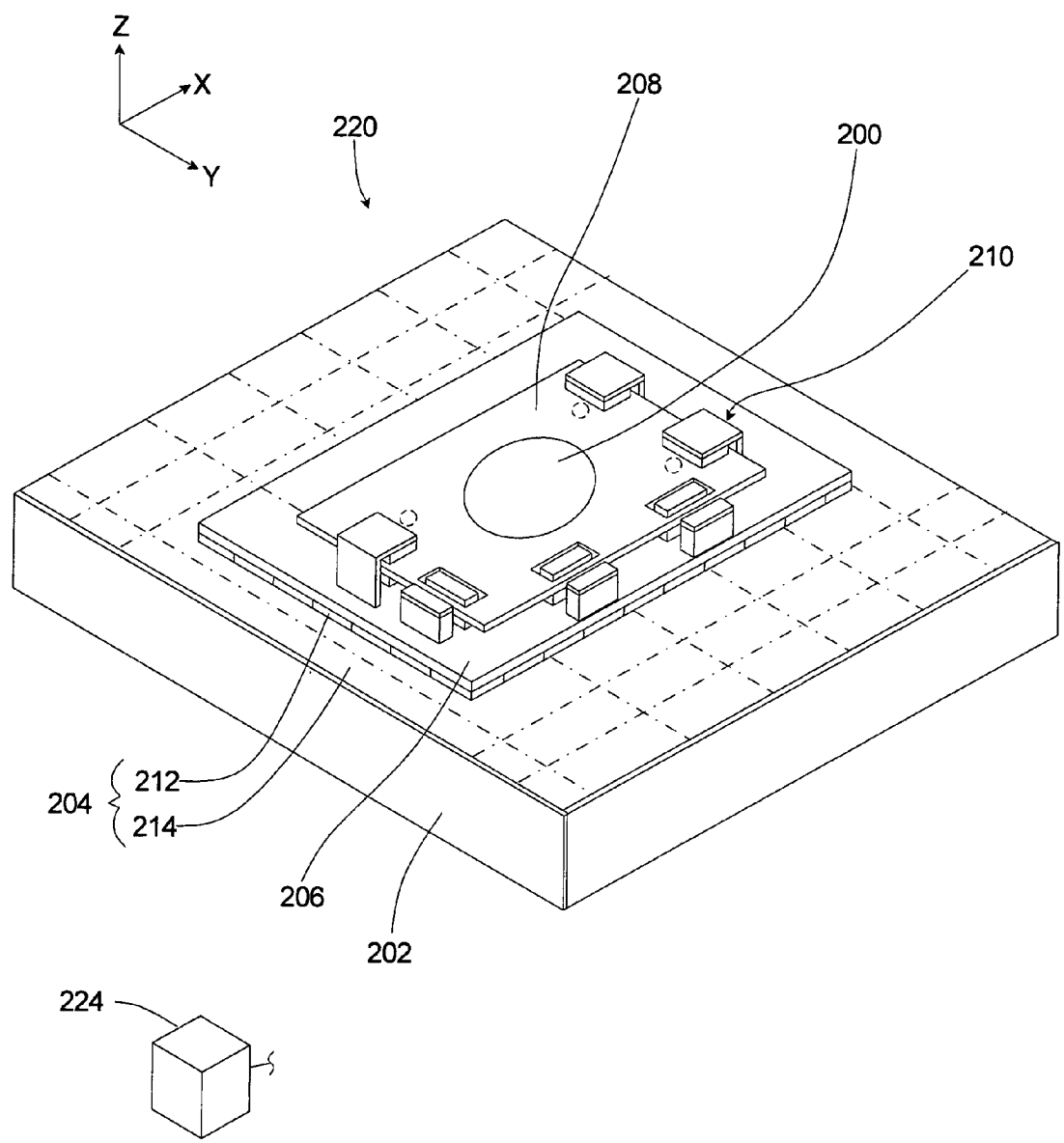
FIG. 2A is a perspective view of a stage assembly having features of the present invention.

FIG. 2A is a perspective view of a stage assembly 220 that is used to position a device 200 and a control system 224. For example, the stage assembly 220 can be used as the wafer stage assembly 20 in the exposure apparatus 10 of FIG. 1. In this embodiment, the stage assembly 220 would position the wafer 28 (illustrated in FIG. 1) during manufacturing of the semiconductor wafer 28. Alternatively, the stage assembly 220 can be used to move other types of devices 200 during manufacturing and/or inspection, to move a device under an electron microscope (not shown), or to move a device during a precision measurement operation (not shown). For example, the stage assembly 220 could be used as the reticle stage assembly 18. It should be noted that the control system 224 is sometimes referred to as being part of the stage assembly 220.

The stage assembly 220 includes a stage base 202, a first stage mover assembly 204, a first stage 206, a second stage 208 and a second stage mover assembly 210. The design of the components of the stage assembly 220 can be varied. For example, in FIG. 2A, the stage assembly 220 includes one first stage 206 and one second stage 208. Alternatively, however, the stage assembly 220 could be designed to include more than one first stage 206 having more than one, second stage 208.

In FIG. 2A, the stage base 202 is generally rectangular shaped. Alternatively, the stage base 202 can be another shape. The stage base 202 supports some of the components of the stage assembly 220 above the mounting base 30 illustrated in FIG. 2A.

The design of the first stage mover assembly 204 can be varied to suit the movement requirements of the stage assembly 220. In one embodiment, the first stage mover assembly 204 includes one or more movers, such as rotary motors, voice coil motors, linear motors utilizing a Lorentz force to generate drive force, electromagnetic actuators, planar motor, or some other force actuators.

In FIG. 2A, the first stage mover assembly 204 moves the first stage 206 relative to the stage base 202 along the X axis, along the Y axis, and about the Z axis (collectively "the planar degrees of freedom"). Additionally, the first stage mover assembly 204 could be designed to move and position the first stage 206 along the Z axis, about the X axis and about the Y axis relative to the stage base 202. Alternatively, for example, the first stage mover assembly 204 could be designed to move the first stage 206 with less than three degrees of freedom.

In FIG. 2A, the first stage mover assembly 204 includes a planar motor. In this embodiment, the first stage mover assembly 204 includes a first mover component 212 that is secured to and moves with the first stage 206 and a second mover component 214 (illustrated in phantom) that is secured to the stage base 202. The design of each component can be varied. For example, one of the mover components 212, 214 can include a magnet array having a plurality of magnets and the other of the mover components 214, 212 can include a conductor array having a plurality of conductors.

In FIG. 2A, the first mover component 212 includes the magnet array and the second mover component 214 includes the conductor array. Alternatively, the first mover component 212 can include the conductor array and the second mover component 214 can include the magnet array. The size and shape of the conductor array and the magnet array and the number of conductors in the conductor array and the number of magnets in the magnet array can be varied to suit design requirements.

The first mover component 212 can be maintained above the second mover component 214 with vacuum pre-load type air bearings (not shown). With this design, the first stage 206 is movable relative to the stage base 202 with three degrees of freedom, namely along the X axis, along the Y axis, and rotatable around the Z axis. Alternatively, the first mover component 212 could be supported above the second mover component 214 by other ways, such as guides, a rolling type bearing, or by the magnetic levitation forces and/or the first stage mover assembly 204 could be designed to be movable with six degrees of freedom. Still alternatively, the first stage mover assembly 204 could be designed to include one or more electromagnetic actuators.

The control system 224 directs electrical current to one or more of the conductors in the conductor array. The electrical current through the conductors causes the conductors to interact with the magnetic field of the magnet array. This generates a force between the magnet array and the conductor array that can be used to control, move, and position the first mover component 212 and the first stage 206 relative to the second mover component 214 and the stage base 202. The control system 224 adjusts and controls the current level for each conductor to achieve the desired resultant forces. Stated another way, the control system 224 directs current to the conductor array to position the first stage 206 relative to the stage base 202.

The second stage 208 includes a device holder (not shown) that retains the device 200. The device holder can include a vacuum chuck, an electrostatic chuck, or some other type of clamp.

The second stage mover assembly 210 moves and adjusts the position of the second stage 208 relative to the first stage 206. For example, the second stage mover assembly 210 can adjust the position of the second stage 208 with six degrees of freedom. Alternatively, for example, the second stage mover assembly 210 can be designed to move the second stage 208 with only three degrees of freedom. The second stage mover assembly 210 can include one or more rotary motors, voice coil motors, linear motors, electromagnetic actuators, or other type of actuators. Still alternatively, the second stage 208 can be fixed to the first stage 206.

Figure 2B:
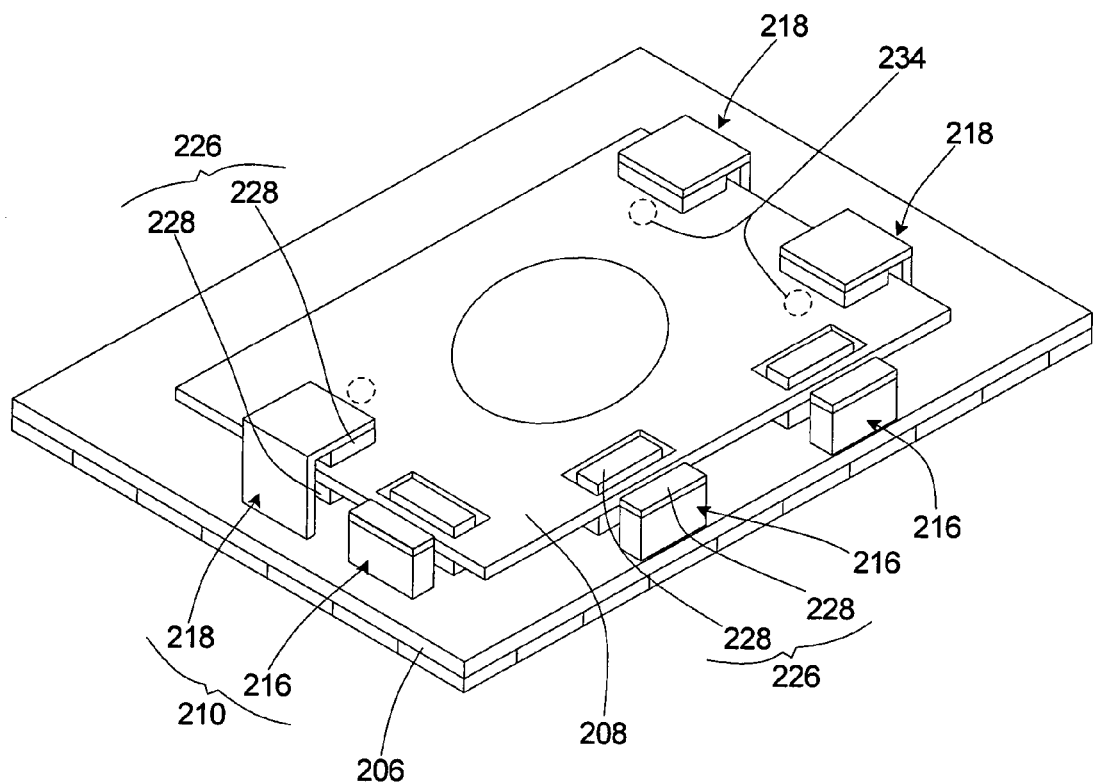
FIG. 2B is a perspective view of a portion of the stage assembly of FIG. 2A.

FIG. 2B illustrates a perspective view of the first stage 206, the second stage 208, and the second stage mover assembly 210 of FIG. 2A. In this embodiment, the second stage mover assembly 210 includes three spaced apart, horizontal movers 216 and three spaced apart, vertical movers 218. The horizontal movers 216 move the second stage 208 along the X axis, along the Y axis and about the Z axis relative to the stage 206 while the vertical movers 218 move the second stage 208 about the X axis, about the Y axis and along the Z axis relative to the stage 206.

In FIG. 2B, each of the horizontal movers 216 and each of the vertical movers 218 includes an actuator pair 226 comprising two electromagnetic actuators 228 (illustrated as blocks in FIG. 2B). Alternatively, for example, one or more of the horizontal movers 216 and/or one or more of the vertical movers 218 can include a voice coil motor or another type of mover.

In FIG. 2B, (i) one of the actuator pairs 226 (one of the horizontal movers 216) is mounted so that the attractive forces produced thereby are substantially parallel with the X axis, (ii) two of the actuator pairs 226 (two of the horizontal movers 216) are mounted so that the attractive forces produced thereby are substantially parallel with the Y axis, and (iii) three actuator pairs 226 (the vertical horizontal movers 216) are mounted so that the attractive forces produced thereby are substantially parallel with the Z axis. With this arrangement, (i) the horizontal movers 216 can make fine adjustments to the position of the second stage 208 along the X axis, along the Y axis, and about the Z axis, and (ii) the vertical movers 218 can make fine adjustments to the position of the second stage 208 along the Z axis, about the X axis, and about the Y axis.

Alternatively, for example, two actuator pairs 226 can be mounted parallel with the X direction and one actuator pair 226 could be mounted parallel with the Y direction. Still alternatively, other arrangements of the actuator pairs 226 are also possible.

The control system 224 (illustrated in FIG. 2A) directs current to the electromagnetic actuators 226 to position the second stage 208.

In one embodiment, the measurement system 22 (illustrated in FIG. 1) includes one or more sensors (not shown in FIG. 2B) that monitor the position of the second stage 208 relative to the first stage 206 and/or the position of second stage 208 relative to another structure, such as the optical assembly 16 (illustrated in FIG. 1).

Additionally, in FIG. 2B, the second stage mover assembly 210 includes one or more stage supports 234 (illustrated in phantom) that extend between the stages 206, 208, support the dead weight of the second stage 208 relative to the first stage 206 and reduce the likelihood of overheating of the vertical movers 218. For example, each stage support 234 can be a fluid bellow. Alternatively, for example, each stage support 234 can be a spring or another type of resilient member. As provided herein, a separate stage support 234 can be positioned next to each vertical mover 218. In one embodiment, each stage support 234 has very low stiffness in all degrees of freedom. For example, each of the stage supports 234 can have a stiffness ($K_{ss}$) along the Z axis of at least approximately 1, 2, 2.5, 3, 3.5, 4, 4.5, or 5 N/mm. Alternatively, the stiffness can be less than 1 or greater than 10 N/mm. In an alternate embodiment, the stage supports 234 can be positioned intermediate the vertical movers 218 and/or the stage supports 234 can be relatively stiff in one or more degrees of freedom.

Figure 2C:
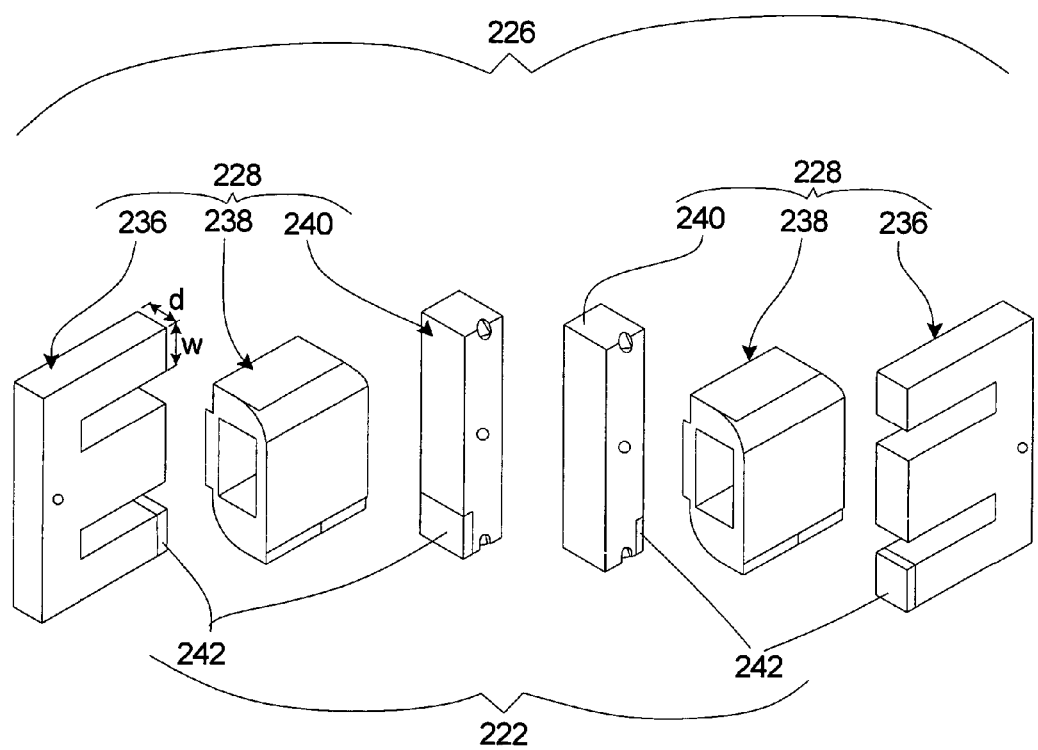
FIG. 2C is a perspective view of an actuator pair having features of the present invention.

FIG. 2C is an exploded perspective view of an actuator pair 226 that can be used for one of the horizontal movers or one of the vertical movers. More specifically, FIG. 2C illustrates two attraction only, electromagnetic actuators 228 commonly referred to as an E/I core actuators. Each E/I core actuator is essentially an electo-magnetic attractive device. Each E/I core actuator 228 includes an E shaped core 236 ("E core"), a tubular shaped conductor 238, and an I shaped core 240 ("I core"). The E core 236 and the I core 240 are each made of a magnetic material such as iron, silicon steel or Ni—Fe steel. The conductor 238 is positioned around the center bar of the E core 236.

The combination of the E core 236 and the conductor 238 is sometimes referred to herein as an electromagnet, while the I core 240 is sometimes referred to herein as a target. As an example, the opposing electromagnets can be mounted to the first stage 206 (illustrated in FIG. 2B) and the targets can be secured to the second stage 208 (illustrated in FIG. 2B) there between the opposing electromagnets. In one embodiment, the I cores 240 are attached to the second stage 208 in such a way that the pulling forces of the opposing actuator pairs 226 do not substantially distort the second stage 208. In one embodiment, the I cores 240 can be integrally formed into the second stage 208. However, the configuration of the cores can be reversed and the I cores can be the secured to the first stage 206 and the E cores can be secured to the second stage 208.

For each actuator pair 226, the electromagnets and targets are mounted so that a gap g separates each electromagnet and target. In one embodiment, the gap is in the range of between approximately 0 and 400 micrometers. The electromagnet actuators 228 illustrated in FIG. 2C are variable reluctance actuators and the reluctance varies with the distance defined by the gap $g_1$ which, of course also varies the flux and the force applied to the target.

In this embodiment, the measurement system 222 includes one or more sensors 242 that measure the gap distance between the E core 236 and the I core 240 for each electromagnetic actuator 228. A suitable sensor, for example, can include a capacitor sensor.

Figure 3:
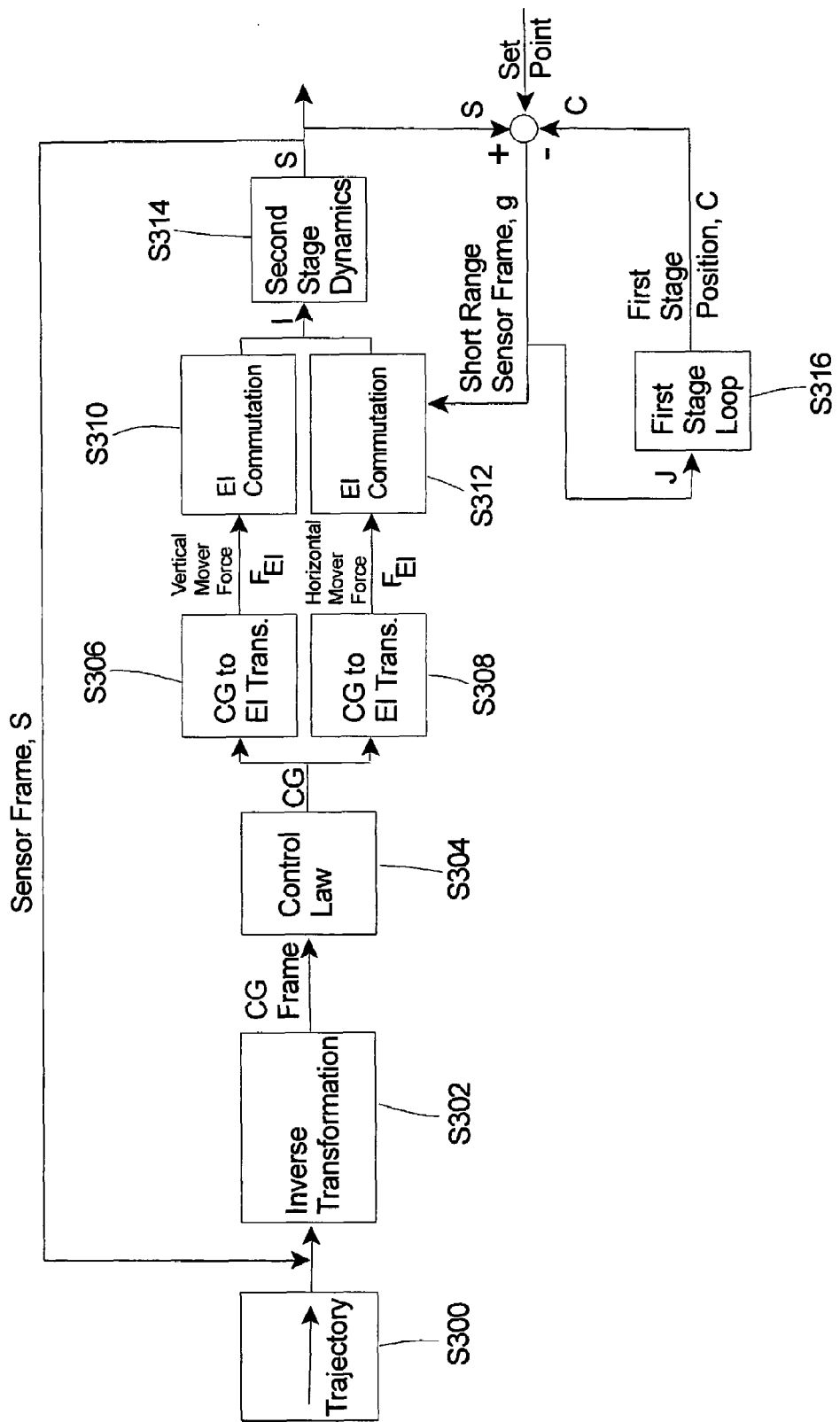
FIG. 3 is a block diagram that illustrates a system for controlling the stage assembly of FIG. 2A.

FIG. 3 is a schematic that illustrates the sensing and control functions of the present device. The sensing and control functions are more thoroughly described in U.S. Pat. No. 6,130,517 that issued on Oct. 10, 2000, Ser. No. 09/139,954 filed Aug. 25, 1998, and U.S. Pat. No. 6,069,417 that issued on May 30, 2000, each of which are hereby incorporated by reference thereto, in their entireties.

In FIG. 3, a trajectory s300, or desired path for the focused optical system to follow is determined based on the desired path of the wafer or other object to which the focused optical system is to be applied. The trajectory s300 is next fed into the control system. The trajectory s300 is compared with a sensor signal vector S sensor frame S that is generated from the output of the measurement system 22 (illustrated in FIG. 1) measuring the present position of the second stage relative to the optical assembly. A difference vector is determined by comparing the trajectory s300 to the sensor signal vector S. The difference vector is transformed to a CG (center of gravity) coordinate frame through an inverse transformation s302. The control law s304 prescribes the corrective action for the signal. The control law may be in the form of a PID (proportional integral derivative) controller, proportional gain controller or a lead-lag filter, or other commonly known law in the art of control, for example.

The vector for vertical motion is fed to the CG to EI-core transformation s306. This transforms the CG signal to a value of force to be generated by the electromagnetic actuators of the vertical movers. The force to be generated and the gap distances $g_1$, $g_2$ are then fed to the EI commutation s310 to determine the current to be directed to the vertical movers. The current is then directed to the vertical movers and the vertical movers move the second stage S314. Similarly, the vector for planar motion is fed to the CG to EI-core transformation, s308. This transforms the CG signal to a force to be generated by the electromagnetic actuators of the horizontal movers. The force to be generated and the gap distances $g_1$, $g_2$ are then fed to the EI commutation s312 to determine the current to be directed to the horizontal movers. The current is then directed to the horizontal movers and the horizontal movers move the second stage s314. The movement of the second stage s314 is measured in the sensor frame S.

A somewhat similar block is not shown in detail below for the second stage loop s316. The first stage position C, is computed using the second stage position S and the gaps $g_1$, $g_2$ measured by the gap sensors. The first stage is servoed and controlled to follow the second stage.

Figure 4A:
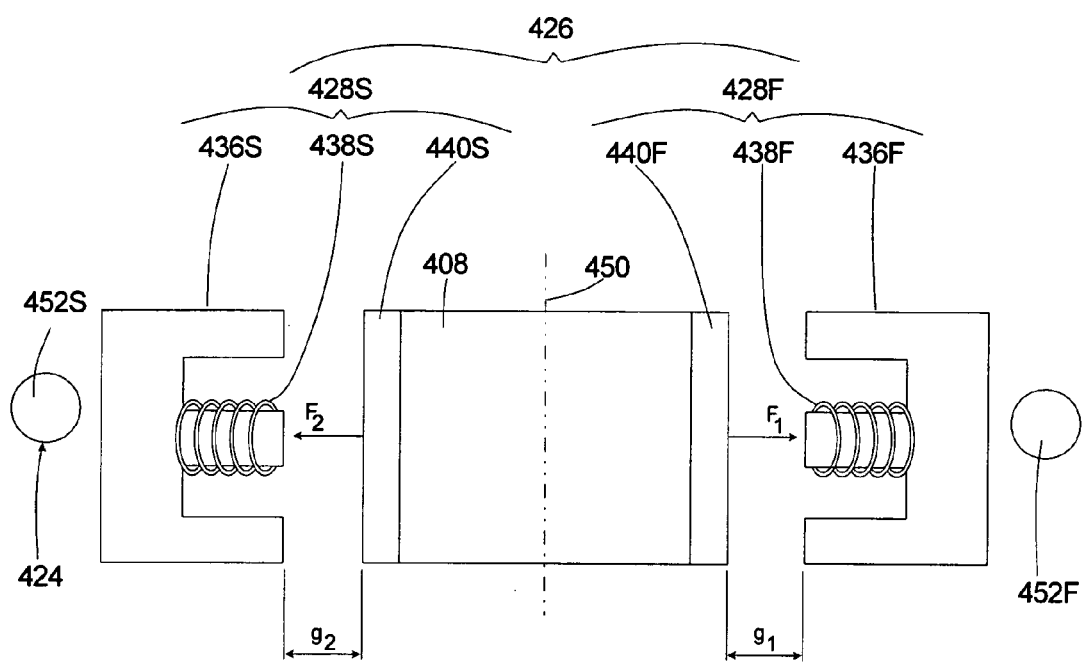
FIG. 4A is a side illustration of an actuator pair, a control system and a stage in an initial position.
Figure 4A:
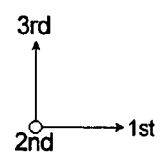

FIG. 4A illustrates a simplified side view of an actuator pair 426 including a first electromagnetic actuator 428F, a second electromagnetic actuator 428S, a stage 408, and a control system 424. In FIG. 4A, (i) the first actuator 428F includes a first E core 436F, a first conductor 438F, and a first I core 440F, and (ii) the second actuator 428S includes a second E core 436S, a second conductor 438S, and a second I core 440S. A first gap $g_1$ separates the first E core 436F and the first conductor 438F from the first I core 440F and a second gap $g_2$ separates the second E core 436S and the second conductor 438S from the second I core 440S. A centerline 450 the stage 403 between the I cores 440F, 440S is also illustrated in FIG. 4A. In FIG. 4A, the stage 408 is at an initial position, the centerline 450 of the stage 408 is centered between the E cores 436F, 436S, and the first gap $g_1$ is equal to the second gap $g_2$. Further, $g_1=g_2=g_0$, where $g_0$ is the initial gap.

The control system 424 independently directs D.C. electric current to each of the actuators 428F, 428S with a variable current first current source 452F that directs a first current $I_1$ to the first conductor 438F and a variable current second current source 452S that directs a second current $I_2$ to the second conductor 438S.

The first current $I_1$ directed through the first conductor 438F generates an electromagnetic field that attracts the first I core 440F towards the first E core 436F and results in an attractive first force $F_1$ across the first gap $g_1$ and the second current $I_2$ directed through the second conductor 438S generates an electromagnetic field that attracts the second I core 440S towards the second E core 436S and results in an attractive second force $F_2$ across the second gap $g_2$. The amount of current determines the amount of attraction. With this design, the first actuator 428F urges the stage 408 with a controlled first force $F_1$ in one direction (to the right along the first axis), and the second actuator 428S urges the stage 408 with a controlled second force $F_2$ in the opposite direction (to the left along the first axis). The net force $\Delta F$ is the difference between the first force $F_1$ and the second force $F_2$.

Thus, $F_1-F_2=\Delta F$.        equation 1

$F_{1\ and\ F2}$ are positive or zero, while the $\Delta F$ can be positive, zero, or negative.

When the first force $F_1$ is equal to the second force $F_2$, the net force $\Delta F$ generated by the actuator pair 426 on the stage 408 is equal to zero and there is no acceleration of the stage 408. However, (i) when the first force $F_1$ is greater than the second force $F_2$, the net force $\Delta F$ is positive and the actuator pair 426 moves the stage 408 to the right along the first axis and (ii) when the second force $F_2$ is greater than the first force $F_1$, the net force $\Delta F$ is negative and the actuator pair 426 moves the stage 408 to the left along the first axis. Stated another way, the actuator pair 426 can be used to move and position the stage 408 left and right along the first axis under the influence of two independent attraction actuators 428. Additional actuator pairs (illustrated in FIG. 2B) can be used to position the stage 408 with up to six degrees of freedom.

The amount of movement is determined by the magnitudes of force $F_1$ and $F_2$ which in turn, are each a function of the amount of current $I_1$, $I_2$ directed to each of the conductors 438F, 438S, and the size of the gaps $g_1$, $g_2$. There is a linear relationship between the net force $\Delta F$ applied to stage 408 and the acceleration of stage 408. Consequently, if a large acceleration is desired, a large net force $\Delta F$ must be applied. To apply a large net force $\Delta F$, the first force $F_1$ must be much larger or much smaller than second force $F_2$.

Figure 4B:
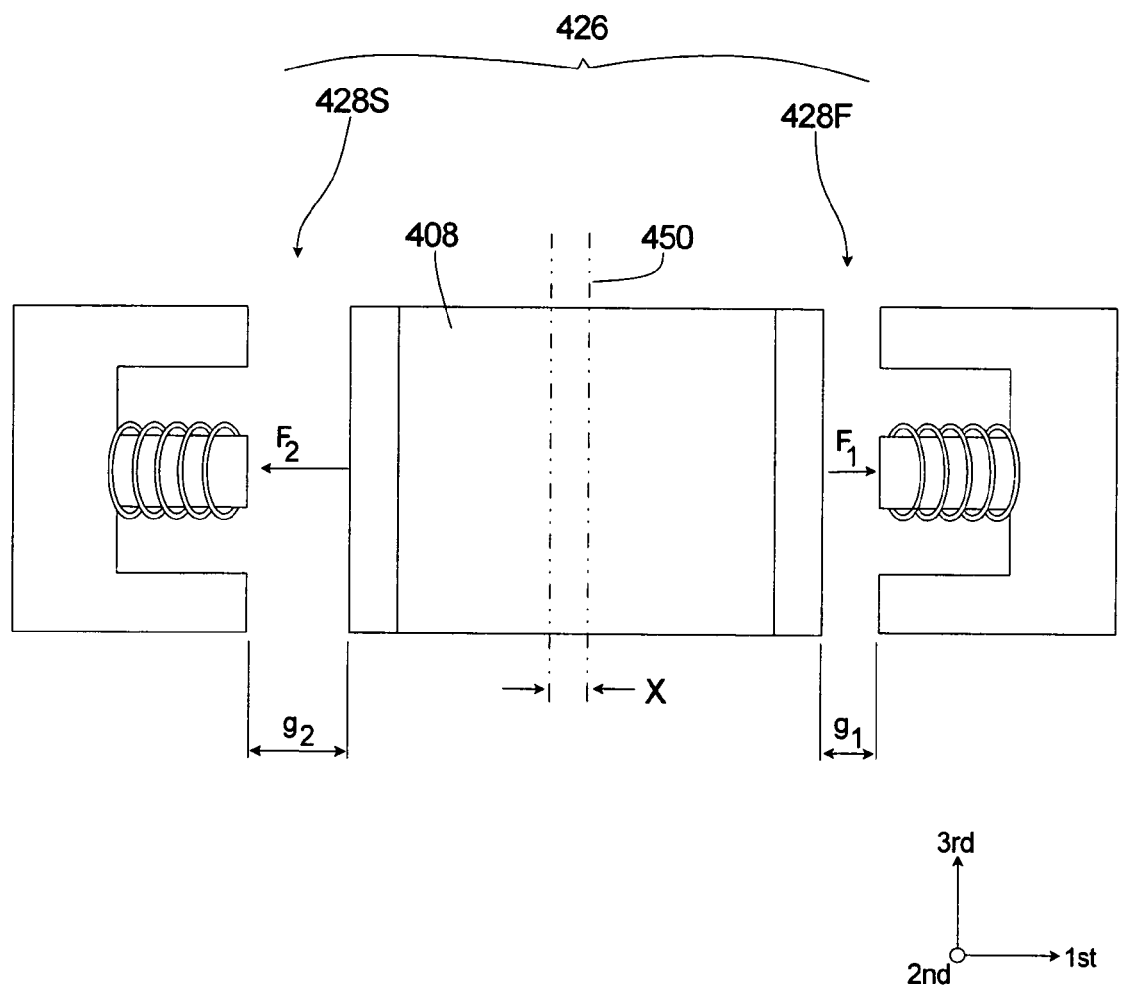
FIG. 4B is a side illustration of the actuator pair, the control system and the stage in a first moved position.

FIG. 4B illustrates that the first actuator 428F and the second actuator 428S of the actuator pair 426 have moved the centerline 450 of the stage 408 to a distance equal to x to the right. At this time, the first gap $g_1=g_0-x$ and the second gap $g_2=g_0+x$.

Figure 4C:
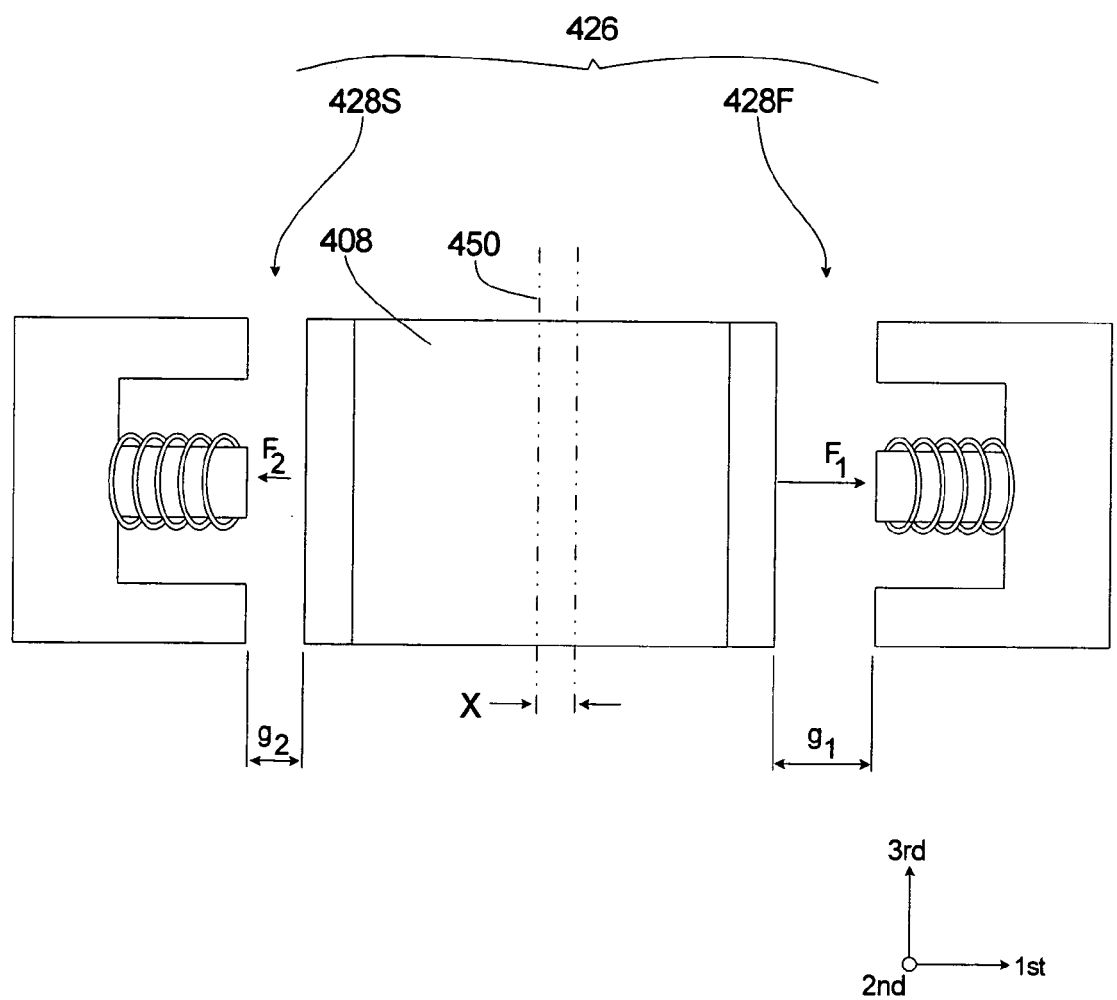
FIG. 4C is a side illustration of the actuator pair, the control system and the stage in a second moved position.

FIG. 4C illustrates that the first actuator 428F and the second actuator 428S of the actuator pair 426 have moved the centerline 450 of the stage 408 to a distance equal to x to the left. At this time, the first gap $g_1=g_0+x$ and the second gap $92=g_0-x$.

Figure 4D:
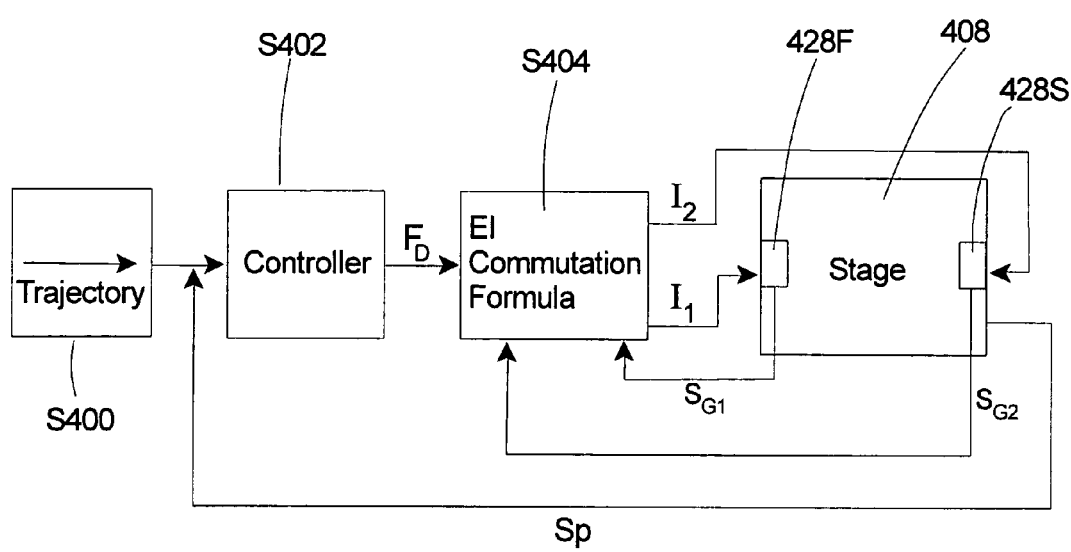
FIG. 4D is a block diagram that illustrates a system for controlling the stage of FIG. 4A.

FIG. 4D is a simplified schematic that illustrates the sensing and control functions of the stage 408 of FIGS. 4A-4C. A trajectory s400 is determined and fed into the control system. The trajectory s400 is compared with a sensor signal vector Sp, that is generated from the output of the measurement system 22 (illustrated in FIG. 1) measuring the position of the stage 408, to determine a difference vector that is then input as an error signal to the controller s402 (a program executed by a microprocessor or microcontroller). The controller s402 determines the amount of desired force $F_D$ that each actuator 428F, 428S is to exert at a particular time to reach the desired position of the stage 408. The commutation formula s404 receives the force signal, uses the measured first gap $S_{G1}$ and the measured second gap $S_{G2}$ and calculates the first current $I_1$ needed at the first actuator 428F and the second current $I_2$ needed at the second actuator 428S to attempt to produce the desired net force $F_D$ on the stage 408 and move the stage 408 in the desired fashion. The currents $I_1$ $I_2$ are directed to the actuators 428F, 428S, the actuators 428F, 428S impart an actual force $F_A$ on the stage 408, and the stage 408 responds to the input. The measurement system $S_p$ monitors the movement of the stage 408.

Stated another way, the control system determines a theoretical desired force $F_D$ at each actuator pair 426 needed to move the stage 408 from the present location to the desired location. This theoretical force $F_D$ is subsequently converted using the commutation to a first current $I_1$ that is directed to the first actuator 428F and a second current $I_2$ that is directed to the second actuator 428S to accurately move the stage 408 to the desired location. The currents $I_1$ $I_2$ are directed to the actuators 428F, 428S and an actual force $F_{A1}$, $F_{A2}$ is applied by each actuator 428F, 428S to the stage 408 and the error signal changes.

In one embodiment, the control system directs current to the actuator pair 426 so that an offset force $F_O$ is generated by each of the actuators 428F, 428S, of the actuator pair 426 in order to prevent undesired acceleration of stage 408, to maintain precise control over the actuator pair 426, and to permit precise control over the stage 408. More specifically, a relatively small first offset current $I_{O1}$ is directed to the first conductor 438F to create a first offset force $F_{O1}$ and a relatively small second current $I_{O2}$ is directed to the second conductor 438S to create a second offset force $F_{O2}$. When the $F_{O1}=F_{O2}$, the net force $\Delta F$ is equal to zero and there is no net force on stage 408. $F_O$ is either positive or zero.

Figure 5:
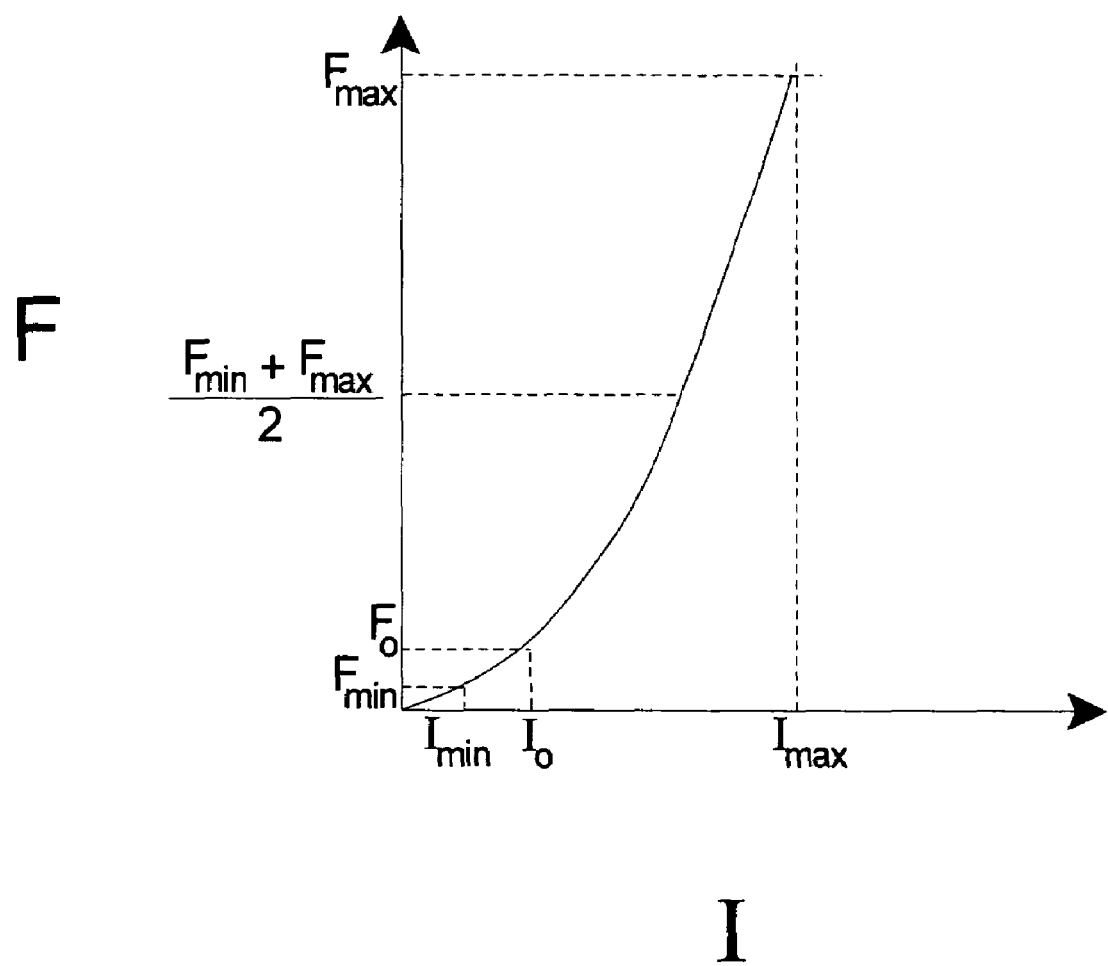
FIG. 5 is a graph that illustrates the relationship between current and force for an actuator having features of the present invention.

FIG. 5 is a graph that illustrates current I directed to an actuator versus force F generated by that actuator. The $I_{min}$ represents the minimum amount of current that the current source can direct to the actuator and $I_{max}$ represents the maximum amount of current that the current source can direct to the actuator. $I_{min}$ directed to the actuator generates $F_{min}$ and $I_{max}$ directed to the actuator generates $F_{max}$. As an example, $I_{min}$ can be approximately 0, 0.00001, 0.0001, 0.00015, or 0.001 amperes and $I_{max}$ can be approximately 0.5, 1, 2, 3, or 4 amperes.

FIG. 5 also illustrates that the bias force $F_O$ generated by the actuator is greater than $F_{min}$ and less than $F_{max}$. In one embodiment, the bias force $F_O$ is located approximately in the center of the force range between $F_{min}$ and $F_{max}$. In this embodiment, $F_O=(F_{min}+F_{max})/2$        equation 2

However, the use of a relatively large offset force $F_O$ and offset current $I_1$ can be disadvantageous because it produces excessive RMS power gain and heat due to the larger current required, and may not provide any greater control over the stage when the stage is not accelerating. Thus, in one embodiment, the control system directs current to the actuator pair so that a relatively small offset force $F_O$ is used to control the stage. More specifically, a provided below and illustrated in FIG. 5, $F_O$ can be less than $(F_{min}+F_{max})/2$.

As provided herein, the EI commutation globally compensates for the non-linearity of E/I core force function and provides a linear transfer function between the input force command and the actual EI force output. The commutation accurately transforms the force command to a current command according to the gap information between the electromagnet and the target. As a result thereof, the commutation reduces the mismatch between the desired force $F_D$ and the actual force $F_A$.

As provided herein, the actual output force $F_A$ generated by one of the actuators of an actuator pair can be expressed as follows:

$$F_A = K_A(I^2)/(g+a_A)(g+b_A) \qquad \text{equation 3}$$

where $F_A$ is in Newtons; $K_A$ is an electromagnetic constant which is dependent upon the geometries of the E core and the I core, and the number of coil turns in the conductor; I is current, measured in amperes that is directed to the conductor; g=the gap distance, measured in meters; $a_A$ is an unknown parameter related to the shape and alignment of the E core and the I core of the actuator; and $b_A$ is another unknown parameter related to the shape and alignment of the E core and the I core of the actuator.

Thus, the actual output force $F_{A1}$ generated by the first actuator can be expressed as follows:

$$F_{A1} = K_A(I_1^2)/(g_1+a_A)(g_1+b_A) \qquad \text{equation 4}$$

Similarly, the actual output force $F_{A2}$ generated by the second actuator can be expressed as follows:

$$F_{A2} = K_A(I_2^2)/(g_2+a_A)(g_2+b_A) \qquad \text{equation 5}$$

For these equations, the actual values of $K_A$, $a_A$, and $b_A$ are not exactly known because they depend upon the geometries, shape and alignment of the E core and the I core.

In one embodiment, $K_A = \frac{1}{2}N^2\mu_o w d$; where N=the number of coil turns in the conductor; $\mu_o$=a physical constant of about $1.26 \times 10^{-6}$ H/m; w=the half width of the center of the E core, in meters; and d=the depth of the center of the E core, in meters. In one embodiment, $K_A = 7.73 \times 10^{-6}$ kg m$^3$/s$^2$A$^2$. w and d are illustrated in FIG. 2C.

The terms $a_A$, $b_A$ for each actuator are determined by experimental testing of the assembled actuator pair.

The desired net force output, $\Delta F$, for an actuator pair can be distributed to the force command for each actuator of the actuator pair, $F_{A1}$ and $F_{A2}$ with the bias of $F_0$. As provided above, the bias force, $F_0$, can be located at the center of the force range. The forces generated by the actuator pair can be expressed by the following equations:

$$F_{A1} = F_0 + \Delta F/2 \qquad \text{equation 6}$$

$$F_{A2} = F_0 - \Delta F/2 \qquad \text{equation 7}$$

$$F_{A1} - F_{A2} = \Delta F \qquad \text{equation 8}$$

The present invention discloses a new force distribution strategy wherein the bias force, $F_0$, is not half of the allowed force range $(F_{min}+F_{max})/2$. However, adjustments are made so that the bias force $F_0$ is lowered.

If the desired force from the first actuator is less than the minimum force that can be generated by the first actuator $(F_{D1} < F_{min})$, then $I_{min}$ is directed to the first actuator and $F_{D1} = F_{min}$.

Because, $F_{D1} - F_{D2} = \Delta F$ then $F_{D2} = F_{min} - \Delta F \qquad \text{equation 9}$ Similarly, if the desired force from the second actuator is less than the minimum force that can be generated by the second actuator $(F_{D2} < F_{min})$, then $I_{min}$ is directed to the second actuator and $F_{D2} = F_{min}$.

Because, $F_{D1} - F_{D2} = \Delta F$ then $F_{D1} = F_{min} + \Delta F \qquad \text{equation 10}$ With this design, $F_0$, is less than $(F_{min}+F_{max})/2$. Stated another way, $F_{min} \leq F_O < (F_{min}+F_{max})/2$. As an example, Fo can be approximately 0, 1, 2, 3, 5, 10, or 15 percent greater than $F_{min}$. Suitable offset currents $I_{O1}$, $I_{O2}$, can be approximately 0, 0.0001, 0.001, 0.01, or 0.02 amperies when the stage is centered between the actuators and $g_1 = g_2 = g_0$.

The following formulas cover the desired forces $F_{D1}$, $F_{D2}$ to be generated by the first actuator and the second actuator, respectively:

$$F_{D1} = F_0 + \frac{\Delta F_D}{2} \qquad \text{equation 11}$$
$$= k_D \frac{I_1^2}{(g_0 - x + a_D)(g_0 - x + b_D)}$$

$$F_{D2} = F_0 - \frac{\Delta F_D}{2} \qquad \text{equation 12}$$
$$= k_D \frac{I_2^2}{(g_0 + x + a_D)(g_0 + x + b_D)}$$

where $a_D$ is the experimental, guessed first parameter, $b_D$ is the experimental, guessed second parameter and $k_D$ is the guessed electromagnetic constant.

Equations 11 and 12 can be converted to determine the current commands $I_1$, $I_2$ needed to generate the desired forces $F_{D1}$, $F_{D2}$.

$$I_1 = \sqrt{\frac{1}{k_D}(g_0 - x + a_D)(g_0 - x + b_D)\left(F_0 + \frac{\Delta F_D}{2}\right)} \qquad \text{equation 13}$$

$$I_2 = \sqrt{\frac{1}{k_D}(g_0 + x + a_D)(g_0 + x + b_D)\left(F_0 - \frac{\Delta F_D}{2}\right)} \qquad \text{equation 14}$$

The following formulas describe the real, actual forces generated by the first actuator:

$$F_{A1} = k_A \frac{I_1^2}{(g_0 - x + a_A)(g_0 - x + b_A)} \qquad \text{equation 15}$$

Substituting equation number 13 into equation number 15 results in:

$$F_{A1} = \frac{k_A}{k_D} \frac{(g_0 - x + a_D)(g_0 - x + b_D)}{(g_0 - x + a_A)(g_0 - x + b_A)}\left(F_0 + \frac{\Delta F_D}{2}\right) \qquad \text{equation 16}$$

If we make the term $A(x) = \frac{k_A}{K_D} \frac{(g_0 - x + a_D)(g_0 - x + b_D)}{(g_0 - x + a_A)(g_0 - x + b_A)} \qquad \text{equation 17}$ then equation 16 can be simplified to be $$F_{A1} = A(x)\left(F_0 + \frac{\Delta F_D}{2}\right) \quad \text{equation 18}$$

Similarly, the following formulas describe the real, actual forces generated by the second actuator:

$$F_{A2} = k_A \frac{I_2^2}{(g_0 + x + a_A)(g_0 + x + b_A)} \quad \text{equation 19}$$

Substituting equation number 14 into equation number 19 results in:

$$F_{A2} = \frac{k_A}{k_D} \frac{(g_0 + x + a_D)(g_0 + x + b_D)}{(g_0 + x + a_A)(g_0 + x + b_A)}\left(F_0 - \frac{\Delta F_D}{2}\right) \quad \text{equation 20}$$

If we make the term $B(x) = \frac{k_A}{k_D} \frac{(g_0 + x + a_D)(g_0 + x + b_D)}{(g_0 + x + a_A)(g_0 + x + b_A)}$ equation 21 then equation 20 can be simplified to be $$F_{A2} = B(x)\left(F_0 - \frac{\Delta F_D}{2}\right) \quad \text{equation 22}$$

As is known, force is equal to mass times acceleration.

$$m\ddot{x} = \Delta F_A = F_{A1} - F_{A2} \quad \text{equation 23}$$

Substituting in the formulas for $F_{A1}$ (equation 18) and $F_{A2}$ (equation 22) from above into equation 23 results in:

$$m\ddot{x} = [A(x) - B(x)]F_0 + [A(x) + B(x)]\frac{\Delta F_D}{2} \quad \text{equation 24}$$

The values for A(x) (equation 17) and B(x) (equation 21) are inserted into equation 24, results in the following equation with a first order Taylor Series approximation:

$$m\ddot{x} = \left[\frac{-2(2g_0 + a_D + b_D)(g_0 + a_A)(g_0 + b_A) +}{(g_0 + a_A)^2(g_0 + b_A)^2}\frac{k_A}{k_D}F_0\right]x + \left[\frac{(g_0 + a_D)(g_0 + b_D)}{(g_0 + a_A)(g_0 + b_D)}\frac{k_A}{k_D}\right]\Delta F_D \quad \text{equation 25}$$

We can make the term $$k_{EI} = \frac{-2(2g_0 + a_D + b_D)(g_0 + a_A)(g_0 + b_A) + 2(2g_0 + a_A + b_A)(g_0 + a_D)(g_0 + b_D)}{(g_0 + a_A)^2(g_0 + b_A)^2}\frac{k_A}{k_D}F_0 \quad \text{equation 26}$$

Further, we can make the term equation 27

$$\eta_{EI} = \frac{(g_0 + a_D)(g_0 + b_D)}{(g_0 + a_A)(g_0 + b_A)}\frac{k_A}{k_D}$$

As a result thereof, equation 25 can be simplified to be:

$$m\ddot{x} = k_{EI}x + \eta_{EI}\Delta F_D \quad \text{equation 28}$$

As provided herein, $k_{EI}$ is equal to the EI stiffness due to commutation mismatch; and $\eta_{EI}$ is equal to the E/I core gain.

Observation 1: Looking at equation 26, E/I core stiffness magnitude ($k_{EI}$) is proportional to bias force $F_O(k_{EI} \propto F_0)$. Thus as the bias force is increased, the E/I core stiffness also is increased. Similarly, as the bias force is decreased, the E/I core stiffness is also decreased.

Observation 2: Looking at equation 26, E/I core stiffness magnitude ($K_{EI}$) is proportional to the parameter errors $a_E$ and $b_E$, thus $k_{EI} \propto a_E$ and $k_{EI} \propto b_E$. The first parameter error $a_E$ is equal to the guessed first parameter $a_D$ minus the actual first parameter $a_A$. ($a_E = a_D - a_A$). The second parameter error $b_E$ is equal to the guessed second parameter $b_D$ minus the actual second parameter $b_A$. ($b_E = b_D - b_A$).

Observation 3: Referring to equation 27, if $\eta_{EI} = 1$ (the E/I core maintains the same gain) then $$k_D^A = \frac{(g_0 + a_D)(g_0 + b_D)}{(g_0 + a_A)(g_0 + b_A)}k_A \quad \text{equation 29}$$

Simplified Case 1, if $b_A = b_D = 0$ then $$F = k\frac{I^2}{g(g+a)} \text{ and} \quad \text{equation 30}$$

$$m\ddot{x} = \left[\frac{2(a_D - a_A)}{(g_0 + a_A)^2}\frac{k_A}{k_D}F_0\right]x + \left[\frac{(g_0 + a_D)}{(g_0 + a_A)}\frac{k_A}{k_D}\right]\Delta F_D \quad \text{equation 31}$$

From this equation $$k_{EI} = \frac{2(a_D - a_A)}{(g_0 + a_A)^2}\frac{k_A}{k_D}F_0 \quad \text{equation 32}$$

$$\eta_{EI} = \frac{g_0 + a_D}{g_0 + a_A}\frac{k_A}{k_D} \quad \text{equation 33}$$

Simplified Case 2, $a_A = b_A$; and $a_D = b_D$ then:

$$F = k\frac{I^2}{(g+a)^2} \quad \text{equation 34}$$

$$m\ddot{x} = \left[\frac{4(a_D - a_A)(g_0 + a_D)}{(g_0 + a_A)^3}\frac{k_A}{k_D}F_0\right]x + \left[\left(\frac{g_0 + a_D}{g_0 + a_A}\right)^2\frac{k_A}{k_D}\right]\Delta F \quad \text{equation 35}$$

From this equation $$k_{EI} = \frac{4(a_D - a_A)(g_0 + a_D)}{(g_0 + a_A)^3}\frac{k_A}{k_D}F_0 \quad \text{equation 36}$$

$$\eta_{EI} = \left(\frac{g_0 + a_D}{g_0 + a_A}\right)^2\frac{k_A}{k_D} \quad \text{equation 37}$$

Operation of the actuator pairs is modeled and controlled as if they were a single mover, instead of requiring two independent control systems.

In designing specific actuator pairs to produce the desired net force output, the proper values for $a_D$ and $b_D$ must be determined. Generally a range of values can be used for both the $a_D$ and $b_D$ parameters. Different values for $a_D$ and $b_D$ can be input into a pair of equations for calculating the forces generated by each of the actuators in the actuator pairs.

After each potential value is input into the equations for $a_D$ and $b_D$, the desired current $I_D$ is calculated for each actuator to achieve a desired force $F_D$, and that the EI stiffness $k_{EI}$ is measured. The $a_D$ and $b_D$ parameters can then be adjusted and new desired currents $I_D$ calculated in an attempt to reduce the magnitude of $k_{EI}$. This process is repeated until the desired EI stiffness $k_{EI}$, e.g. approximately zero in one embodiment, is achieved and no improvements are believed to be attainable. Then, the $a_D$ and $b_D$ parameters are formally input into the E/I core commutation, and the E/I core is then most suitable for its intended use.

Figures 6, 7:
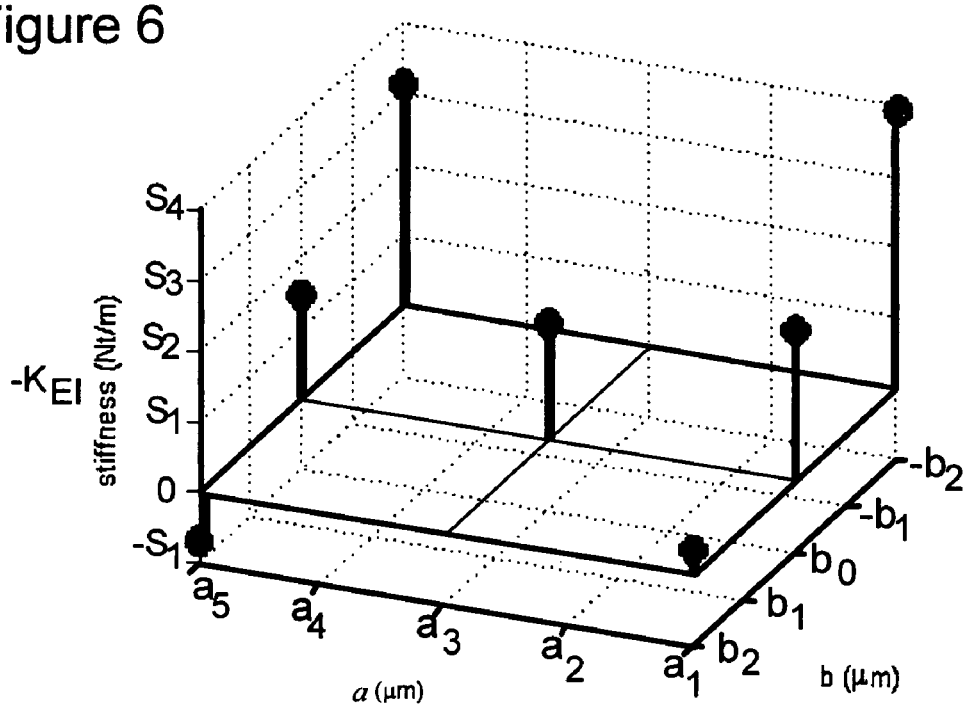
FIG. 6 is a graph that illustrates values for a first parameter, a second parameter and stiffness due to commutation mismatch for an actuator pair.
FIG. 7 is a chart that details the stiffness due to commutation mismatch for an actuator pair for different values of the first parameter and the second parameter.

FIG. 6 is a graph that illustrates the values of the first parameter (a), the second parameter (b), and the stiffness due to commutation mismatch for an actuator pair ($k_{EI}$). FIG. 7 is a chart that details examples of possible stiffness due to commutation mismatch for four alternative actuator pairs with different values of the first parameter (a) and the second parameter value (b). The values for only one of the actuator pairs was actually measured by experimental testing. Further, the results for each of the actuator pairs will vary according to the design of each actuator pair. For testing, $x=o_D$, $F_D=1e-4$ and $I_D=0.1A$. Further, $g_1$ and $g_2$ was a number between approximately 150 and 250 µm.

It should be noted from a review of FIG. 7, for a given actuator pair, that the parameters (a), (b), can be adjusted to achieve the desired commutation mismatch $-K_{EI}$. Stated another way, FIG. 7 illustrates that the parameters (a), (b) can be fine tuned to achieve the desired commutation mismatch $-K_{EI}$. For example, if the stage assembly 220 (illustrated in FIG. 2A) does not include any stage supports 234 (illustrated in FIG. 2B), the parameters (a), (b), can be adjusted so that the commutation mismatch $-K_{EI}$ is approximately equal to zero. For the first actuator pair, for example, when the first parameter (a) has a value of 180 µM and the second parameter (b) has a value of 20 µm, the commutation mismatch $-K_{EI}$ is the closest to zero, namely 4 (N/M). In this case, the first parameter (a) value of 180 µM and the second parameter (b) value of 20 µm are utilized.

Alternatively, for example, if the stage assembly 220 (illustrated in FIG. 2A) includes one or more stage supports 234 (illustrated in FIG. 2B), the parameters (a), (b), can be adjusted to compensate for the stiffness of the stage supports 234. For example, if the stage supports 234 have a stiffness of approximately 6 (N/M), the parameters should be determined to compensate for the stiffness of the stage supports. For the first actuator pair, for example, when the first parameter (a) has a value of 220 µM and the second parameter (b) has a value of 20 µm, the commutation mismatch $-K_{EI}$ is equal to $-5$ (N/M). In this case, the first parameter (a) value of 220 µM and the second parameter (b) value of 20 µm are utilized so that the commutation mismatch $-K_{EI}$ is approximately equal in magnitude and opposite to the stiffness of the stage supports 234, namely 6 (N/M).

Still alternatively, for example, if the stage supports 234 have a stiffness of approximately 20 (N/M), the parameters should be determined to compensate for the stiffness of the stage supports. In this example, for the third actuator pair, when the first parameter (a) has a value of 220 µM and the second parameter (b) has a value of 20 µm, the commutation mismatch $-K_{EI}$ is equal to approximately $-18$ (N/M). In this case, the first parameter (a) value of 220 µM and the second parameter (b) value of 20 µm are utilized so that the commutation mismatch $-K_{EI}$ is approximately equal magnitude and opposite to the stiffness of the stage supports 234, namely 20 (N/M).

Figure 8:
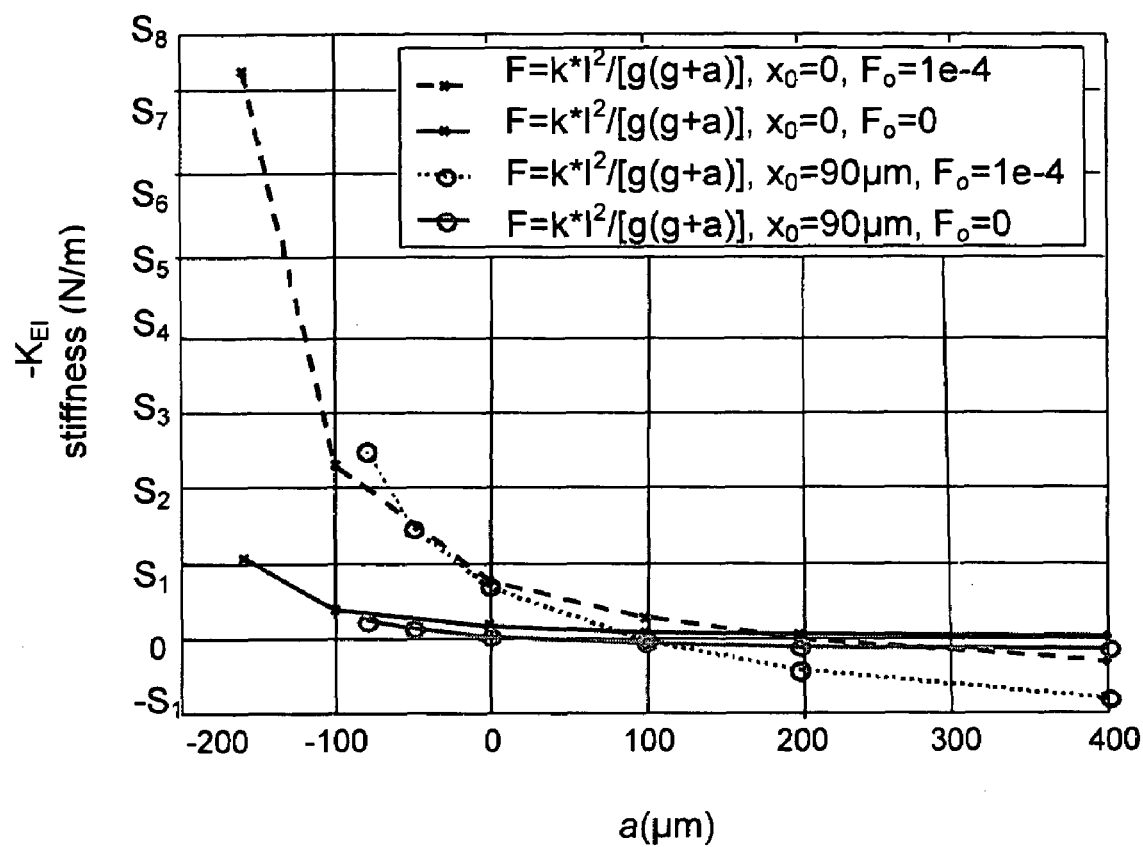
FIG. 8 is a graph that illustrates stiffness versus the first parameter.

FIG. 8 is a graph that illustrates stiffness versus the first parameter. In FIG. 8, the second parameter (b) is equal to zero. FIG. 8 illustrates the relationship between the first parameter (a) and the bias force $F_O$. The values for stiffness achieved will vary according to the design of the actuator pair. For example, the value of $S_1$ in FIG. 8 can alternatively be 1500, 2000, or 2500 (N/M).

Also, certain remarks can be noted in relation to the use of the EI commutation provided herein:
1) Referring to equation 26, the bias force $F_O$ should be as small as possible to reduce the E/I core stiffness $K_{EI}$ if the stage assembly does not include any stage supports 234 (illustrated in FIG. 2B).
2) The mismatch of commutation parameters $a_D$ $b_D$ leads to different system characteristics. Stated another way, as the commutation parameters a, b, are changed, the characteristics of the system are changed. For example, referring back to equations 31 and 35,
    if $a_D > a_A \rightarrow k_{EI} > 0$ and the system is open loop unstable
    if $a_D = a_A \rightarrow k_{EI} = 0$ and the system is ideal (if the stage assembly does not have stage supports)
    if $a_D < a_A \rightarrow k_{EI} < 0$ and the system is open loop stable, spring effect
The open loop poles vary with commutation parameters.
3) Physical system stiffness may be compensated by the stiffness created from intentional commutation parameter a, b mismatch. More specifically, if the stage assembly includes one or more stage supports 234, the commutation parameters a, b can be intentionally mismatched to create the desired stiffness.

$$m\ddot{x} + K_{ss}x = k_{EI}x + \eta_{EI}\Delta F_D \qquad \text{equation 38}$$

$K_{ss}$ is the stiffness of the stage supports. The commutation parameters a, b are adjusted until $k_{EI} = K_{ss}$.

In terms of sensitivity, in one embodiment, the commutation parameters a, b are changed to make the total system stiffness become zero.

$$K_{total} = K_{ss} - k_{EI} = 0 \qquad \text{equation 39}$$

$$m\ddot{x} + K_{total}x = \eta_{EI}\Delta F_D \qquad \text{equation 40}$$

The E/I core gain can be normalized to maintain the same closed loop bandwidth while fine-tuning the commutation parameters $a_D$ and $b_D$.

$$k^\Delta = \frac{(g_0 + a_D)(g_0 + b_D)}{(g_0 + a_A)(g_0 + b_A)} k_A \Rightarrow \qquad \text{equation 41}$$

$$\eta_{EI} = \frac{(g_0 + \hat{a})(g_0 + b)}{(g_0 + a)(g_0 + b)} \frac{k}{k} \approx 1$$

Figure 9A:
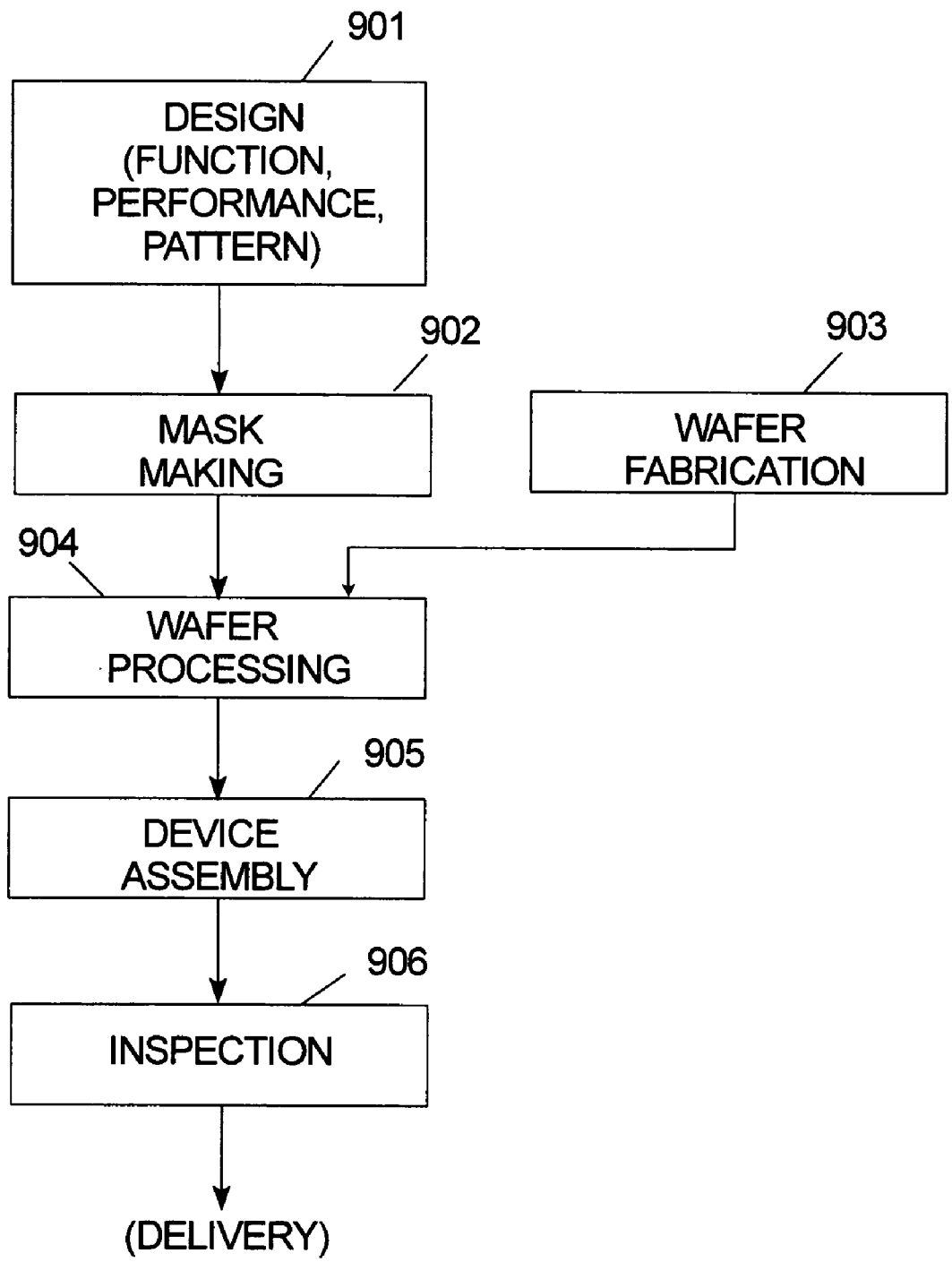
FIG. 9A is a flow chart that outlines a process for manufacturing a device in accordance with the present invention.
Figure 9B:
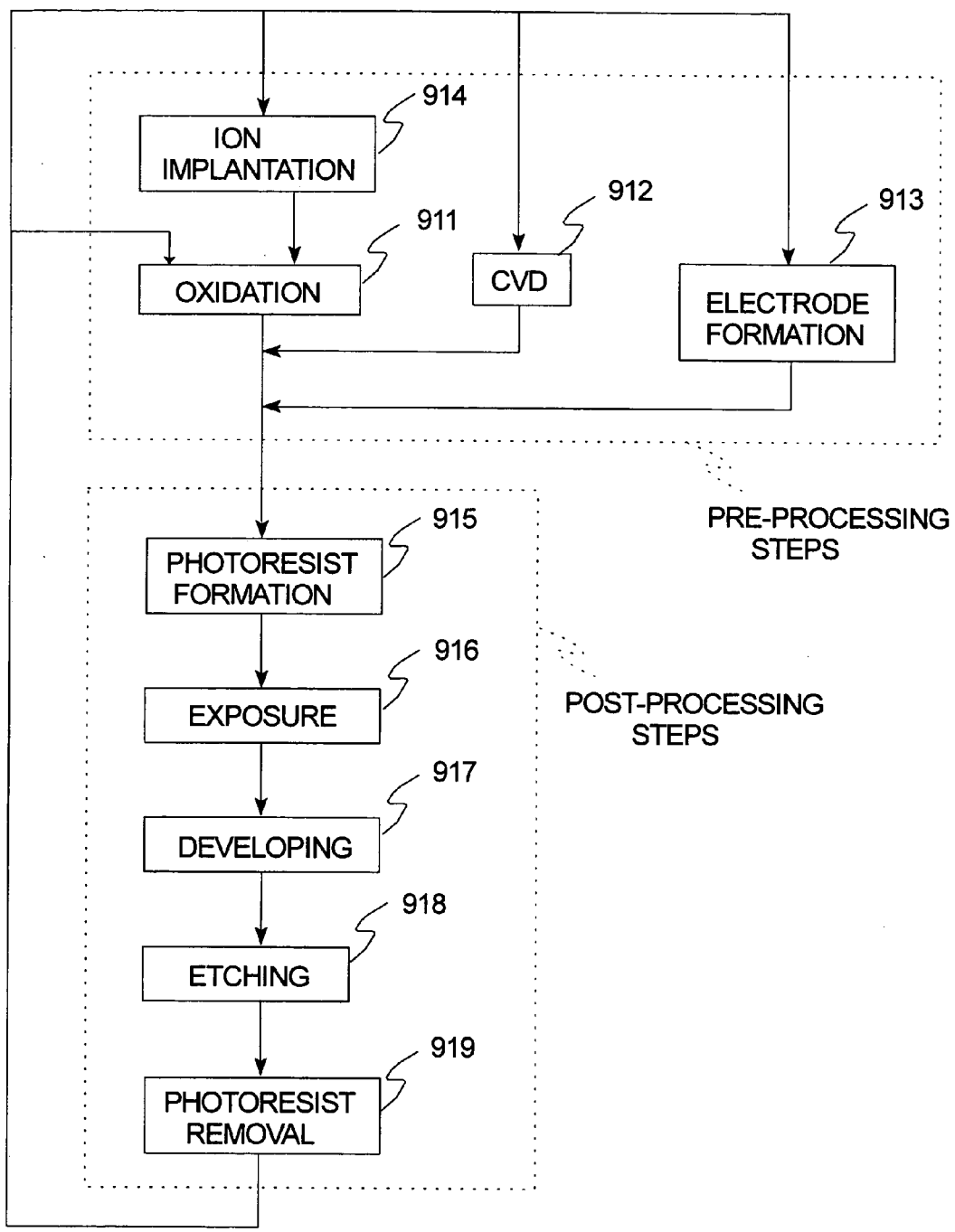
FIG. 9B is a flow chart that outlines device processing in more detail.

Semiconductor devices can be fabricated using the above described systems, by the process shown generally in FIG. 9A. In step 901 the device's function and performance characteristics are designed. Next, in step 902, a mask (reticle) having a pattern is designed according to the previous designing step, and in a parallel step 903 a wafer is made from a silicon material. The mask pattern designed in step 902 is exposed onto the wafer from step 903 in step 904 by a photolithography system described hereinabove in accordance with the present invention. In step 905 the semiconductor device is assembled (including the dicing process, bonding process and packaging process), finally, the device is then inspected in step 906. FIG. 9B illustrates a detailed flowchart example of the above-mentioned step 904 in the case of fabricating semiconductor devices. In FIG. 9B, in step 911 (oxidation step), the wafer surface is oxidized. In step 912 (CVD step), an insulation film is formed on the wafer surface. In step 913 (electrode formation step), electrodes are formed on the wafer by vapor deposition. In step 914 (ion implantation step), ions are implanted in the wafer. The above mentioned steps 911-914 form the preprocessing steps for wafers during wafer processing, and selection is made at each step according to processing requirements. At each stage of wafer processing, when the above-mentioned preprocessing steps have been completed, the following post-processing steps are implemented. During post-processing, first, in step 915 (photoresist formation step), photoresist is applied to a wafer. Next, in step 916 (exposure step), the above-mentioned exposure device is used to transfer the circuit pattern of a mask (reticle) to a wafer. Then in step 917 (developing step), the exposed wafer is developed, and in step 918 (etching step), parts other than residual photoresist (exposed material surface) are removed by etching. In step 919 (photoresist removal step), unnecessary photoresist remaining after etching is removed. Multiple circuit patterns are formed by repetition of these preprocessing and post-processing steps.

While the particular stage assembly and commutation formula as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A stage assembly comprising:
   a stage;
   a first actuator that is coupled to the stage, the first actuator having a first E core and a first I core that is spaced apart a first gap from the first E core; and
   a control system that directs current to the first actuator to move the stage, wherein the amount of current directed to the first actuator is determined utilizing a first parameter and a second parameter that are added to a numerical value representative of the first gap.

2. The stage assembly of claim 1 wherein the value of the first parameter is determined by experimental testing.

3. The stage assembly of claim 1 wherein the first parameter has a value of between approximately 0 and 600 micrometers.

4. The stage assembly of claim 1 wherein the current directed to the first actuator is calculated using the formula:

$$I_1 = \sqrt{\frac{1}{K_D}(g_1 + a)(g_1 + b)\left(F_0 - \frac{\Delta F_D}{2}\right)}$$

where $I_1$, is the current, $K_D$ is the electromagnetic constant, $g_1$ is the first gap, a is the first parameter, b is the second parameter, $F_O$ is a bias force and $\Delta F_D$ is the net force generated by the actuator pair.

5. The stage assembly of claim 4 wherein at least one of the parameters has a value that is not equal to zero.

6. The stage assembly of claim 4 wherein both of the parameters has a value that is not equal to zero.

7. The stage assembly of claim 1 further comprising a stage support that supports the stage and wherein the value of the first parameter is adjusted to compensate for a stiffness of the stage support.

8. The stage assembly of claim 1 wherein the control system directs current to the first actuator so that a bias force generated by the first actuator is greater than a minimum force that can be generated by the first actuator but less than one half of the sum of the minimum force and a maximum force that can be generated by the first actuator.

9. The stage assembly of claim 1 wherein the first actuator is an electromagnetic actuator.

10. The stage assembly of claim 1 further comprising a second actuator that is coupled to the stage, the second actuator having a second E core and a second I core that is spaced apart a second gap from the second E core; and the control system that directs current to the second actuator to move the stage, wherein the amount of current directed to the second actuator is determined utilizing adding the first parameter to the second gap.

11. An exposure apparatus including an illumination source and the stage assembly of claim 1 positioned near the illumination source.

12. The stage assembly of claim 1 wherein the amount of current directed to the first actuator is calculated using (i) the numerical value representative of the first gap plus the first parameter, multiplied by (ii) the numerical value representative of the first gap plus the second parameter.

13. A method for positioning a stage, the method comprising the steps of:
    coupling a first actuator to the stage, the first actuator having a first E core and a first I core that is spaced apart a first gap from the first E core; and
    directing current with a control system to the first actuator to move the stage with a control system, wherein the amount of current directed to the first actuator is determined utilizing a first parameter and a second parameter that are added to a numerical value representative of the first gap.

14. The method of claim 13 further comprising the step of testing to determine the value of the first parameter.

15. The method of claim 13 wherein the first parameter has a value of between approximately 0 and 600 micrometers.

16. The method of claim 13 wherein the current directed to the first actuator is calculated using the formula:

$$I_1 = \sqrt{\frac{1}{K_D}(g_1 + a)(g_1 + b)\left(F_0 - \frac{\Delta F_D}{2}\right)}$$

where $I_1$, is the current, $K_D$ is the electromagnetic constant, $g_1$ is the first gap, a is the first parameter, b is the second parameter, $F_O$ is a bias force and $\Delta F_D$ is the net force generated by the actuator pair.

17. The method of claim 16 wherein at least one of the parameters has a value that is not equal to zero.

18. The method of claim 16 wherein both of the parameters has a value that is not equal to zero.

19. The method of claim 13 wherein the first actuator is an electromagnetic actuator.

20. The method of claim 13 further comprising the step of coupling a second actuator to the stage, the second actuator having a second E core and a second I core that is spaced apart a second gap from the second E core; and directs current to the second actuator to move the stage, wherein the amount of current directed to the second actuator is determined utilizing adding the first parameter to the second gap.

21. A method for making an exposure apparatus for transferring an image from a reticle to a wafer, the method comprising the steps of:
providing an illumination system that directs an illumination beam at the reticle; and
providing an optical assembly that is purged by the method of claim 13.

22. The method of claim 15 wherein the amount of current directed to the first actuator is calculated using (i) the numerical value representative of the first gap plus the first parameter, multiplied by (ii) the numerical value representative of the first gap plus the second parameter.

23. A method for making an object including the steps of:
providing a substrate;
providing an illumination system that directs an illumination beam at a reticle;
providing a stage that retains the substrate;
coupling a first actuator to the stage, the first actuator having a first E core and a first I core that is spaced apart a first gap from the first E core; and
directing current with a control system to the first actuator to move the stage with a control system, wherein the amount of current directed to the first actuator is determined utilizing a first parameter and a second parameter that are added to a numerical value representative of the first gap.

24. A method of making a wafer including the steps of:
providing a substrate;
providing an illumination system that directs an illumination beam at a reticle that transferred to the substrate;
providing a stage that retains the substrate;
coupling a first actuator to the stage, the first actuator having a first E core and a first I core that is spaced apart a first gap from the first E core; and irecting current with a control system to the first actuator to move the stage with a control system, wherein the amount of current directed to the first actuator is determined utilizing a first parameter and a second parameter that are added to a numerical value representative of the first gap.

25. A stage assembly comprising:
a stage;
a first actuator that is coupled to the stage, the first actuator having a first E core and a first I core that is spaced apart a first gap from the first E core; and
a control system that directs current to the first actuator to move the stage, wherein the amount of current directed to the first actuator is calculated using the formula:

$$I_1 = \sqrt{\frac{1}{K_D}(g_1 + a)(g_1 + b)\left(F_0 - \frac{\Delta F_D}{2}\right)}$$

where $I_1$, is the current, $K_D$ is the electromagnetic constant, $g_1$ is the first gap, a is the first parameter, b is the second parameter, $F_O$ is a bias force and $\Delta F_D$ is the net force generated by the actuator pair.

26. The stage assembly of claim 25 wherein at least one of the parameters has a value that is not equal to zero.

27. The stage assembly of claim 25 wherein both of the parameters has a value that is not equal to zero.

28. A method for positioning a stage, the method comprising the steps of:
coupling a first actuator to the stage, the first actuator having a first E core and a first I core that is spaced apart a first gap from the first E core; and
directing current with a control system to the first actuator to move the stage with a control system, wherein the amount of current directed to the first actuator is calculated using the formula:

$$I_1 = \sqrt{\frac{1}{K_D}(g_1 + a)(g_1 + b)\left(F_0 - \frac{\Delta F_D}{2}\right)}$$

where $I_1$, is the current, $K_D$ is the electromagnetic constant, $g_1$ is the first gap, a is the first parameter, b is the second parameter, $F_O$ is a bias force and $\Delta F_D$ is the net force generated by the actuator pair.

29. The method of claim 28 wherein at least one of the parameters has a value that is not equal to zero.

30. The method of claim 28 wherein both of the parameters has a value that is not equal to zero.

31. A stage assembly comprising:
a stage;
a stage support that supports the stage;
a first actuator that is coupled to the stage, the first actuator having a first E core and a first I core that is spaced apart a first gap from the first E core; and
a control system that directs current to the first actuator to move the stage, wherein the amount of current directed to the first actuator is determined utilizing a first parameter that is added to a numerical value representative of the first gap, wherein the value of the first parameter is adjusted to compensate for a stiffness of the stage support.

32. A stage assembly comprising:
a stage;
a first actuator that is coupled to the stage, the first actuator having a first E core and a first I core that is spaced apart a first gap from the first E core; and
a control system that directs current to the first actuator to move the stage, wherein the amount of current directed to the first actuator is determined utilizing a first parameter that is added to a numerical value representative of the first gap, wherein the control system directs current to the first actuator so that a bias force generated by the first actuator is greater than a minimum force that can be generated by the first actuator but less than one half of the sum of the minimum force and a maximum force that can be generated by the first actuator.

* * * * *

UNITED STATES PATENT AND TRADEMARK OFFICE
CERTIFICATE OF CORRECTION

| | | |
|---|---|---|
| PATENT NO. | : 7,253,576 B2 | |
| APPLICATION NO. | : 10/819041 | |
| DATED | : August 7, 2007 | |
| INVENTOR(S) | : Pai-Hsueh Yang et al. | |

It is certified that error appears in the above-identified patent and that said Letters Patent is hereby corrected as shown below:

In the Claims:

Column 21, Line 37, delete "irecting" and substitute -- directing --.

Signed and Sealed this

Twenty-third Day of October, 2007

JON W. DUDAS
*Director of the United States Patent and Trademark Office*